US010012903B2

(12) United States Patent
Hatakeyama et al.

(10) Patent No.: US 10,012,903 B2
(45) Date of Patent: Jul. 3, 2018

(54) RESIST COMPOSITION AND PATTERN FORMING PROCESS

(71) Applicant: SHIN-ETSU CHEMICAL CO., LTD., Tokyo (JP)

(72) Inventors: Jun Hatakeyama, Joetsu (JP); Koji Hasegawa, Joetsu (JP)

(73) Assignee: SHIN-ESTU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/460,454

(22) Filed: Mar. 16, 2017

(65) Prior Publication Data

US 2017/0277037 A1 Sep. 28, 2017

(30) Foreign Application Priority Data

Mar. 28, 2016 (JP) ................................ 2016-063442
Sep. 8, 2016 (JP) ................................ 2016-175472

(51) Int. Cl.

| | |
|---|---|
| ***G03F 7/039*** | (2006.01) |
| ***G03F 7/20*** | (2006.01) |
| ***C08F 220/28*** | (2006.01) |
| ***C08F 220/30*** | (2006.01) |
| ***G03F 7/16*** | (2006.01) |
| ***C08F 220/36*** | (2006.01) |
| ***G03F 7/004*** | (2006.01) |
| ***G03F 7/38*** | (2006.01) |
| ***G03F 7/32*** | (2006.01) |
| ***C08F 220/52*** | (2006.01) |
| ***G03F 7/038*** | (2006.01) |

(52) U.S. Cl.

CPC ............ *G03F 7/039* (2013.01); *C08F 220/28* (2013.01); *C08F 220/30* (2013.01); *C08F 220/36* (2013.01); *C08F 220/52* (2013.01); *G03F 7/0045* (2013.01); *G03F 7/0382* (2013.01); *G03F 7/0392* (2013.01); *G03F 7/162* (2013.01); *G03F 7/168* (2013.01); *G03F 7/2041* (2013.01); *G03F 7/327* (2013.01); *G03F 7/38* (2013.01); *C08F 2220/282* (2013.01); *C08F 2220/283* (2013.01); *C08F 2220/301* (2013.01); *C08F 2220/365* (2013.01)

(58) Field of Classification Search

CPC .... C08F 220/52; C08F 220/36; C08F 220/30; C08F 220/28; C08F 2220/282; C08F 2220/283; G03F 7/039; G03F 7/0382; G03F 7/0392; G03F 7/162; G03F 7/327; G03F 7/168; G03F 7/0045; G03F 7/2041; G03F 7/38

See application file for complete search history.

(56) References Cited

U.S. PATENT DOCUMENTS

| | | | | |
|---|---|---|---|---|
| 7,482,108 | B2 | 1/2009 | Matsumaru et al. | |
| 2012/0148954 | A1 * | 6/2012 | Fukumoto ............... | C08F 20/26 430/283.1 |
| 2013/0164676 | A1 | 6/2013 | Fukumoto et al. | |
| 2013/0230802 | A1 * | 9/2013 | Aratani ................ | C07D 307/93 430/270.1 |
| 2015/0037733 | A1 * | 2/2015 | Takeda ................. | C07D 275/06 430/270.1 |

FOREIGN PATENT DOCUMENTS

| | | | | |
|---|---|---|---|---|
| JP | 2006-178317 | A | | 7/2006 |
| JP | 2011-203656 | A | | 10/2011 |
| JP | 2012-62371 | A | | 3/2012 |
| JP | 2012-197382 | A | | 10/2012 |
| JP | WO2013/129342 | A1 | | 7/2015 |
| JP | 2006-45311 | A | | 2/2016 |
| KR | 10-2010-0068 | A | * | 6/2010 |
| WO | 2011/024953 | A1 | | 3/2011 |
| WO | 2012/043102 | A1 | | 4/2012 |
| WO | WO 2013/129342 | A1 | * | 9/2013 |

OTHER PUBLICATIONS

English translation of Kr-10-2010-0068778-A puplised Jun. 24, 2010, 18 pages. This document is performed by machine translation, and KIPO is not responsible for the result of translation.*

Kishikawa et al., "Assessment of Trade-Off Between Resist Resolution and Sensitivity for Optimization of Hyper-NA Immersion Lithography", Proc. of SPIE, vol. 6520, pp. 65203L-1-65203L-9, (2007).

* cited by examiner

*Primary Examiner* — Cynthia Hamilton
(74) *Attorney, Agent, or Firm* — Westerman, Hattori, Daniels & Adrian, LLP

(57) ABSTRACT

A resist composition is provided comprising a polymer comprising recurring units (a) having a succinimide structure and recurring units (b) containing a group capable of polarity switch with the aid of acid. The resist composition suppresses acid diffusion, exhibits a high resolution, and forms a pattern of satisfactory profile with low edge roughness.

8 Claims, No Drawings

RESIST COMPOSITION AND PATTERN FORMING PROCESS

CROSS-REFERENCE TO RELATED APPLICATION

This non-provisional application claims priority under 35 U.S.C. § 119(a) on Patent Application Nos. 2016-063442 and 2016-175472 filed in Japan on Mar. 28, 2016 and Sep. 8, 2016, respectively, the entire contents of which are hereby incorporated by reference.

TECHNICAL FIELD

This invention relates to a resist composition and a patterning process using the composition.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as EB or X-ray, hydrocarbons used in resist materials have little absorption. Then resist materials based on polyhydroxystyrene composed mainly of hydrocarbon are under consideration.

The exposure system for mask manufacturing made a transition from the laser beam exposure system to the EB exposure system to increase the accuracy of line width. Since a further size reduction became possible by increasing the accelerating voltage of the electron gun in the EB exposure system, the accelerating voltage increased from 10 kV to 30 kV and reached 50 kV in the current mainstream system, with a voltage of 100 kV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control. However, electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are studied.

As the feature size reduces, image blurs due to acid diffusion become a problem. To insure resolution for fine patterns with a size of 45 nm et seq., not only an improvement in dissolution contrast is important as previously reported, but control of acid diffusion is also important as reported in Non-Patent Document 1. Since chemically amplified resist compositions are designed such that sensitivity and contrast are enhanced by acid diffusion, an attempt to minimize acid diffusion by reducing the temperature and/or time of post-exposure bake (PEB) fails, resulting in drastic reductions of sensitivity and contrast.

A triangular tradeoff relationship among sensitivity, resolution, and edge roughness has been pointed out. Specifically, a resolution improvement requires to suppress acid diffusion whereas a short acid diffusion distance leads to a loss of sensitivity.

The addition of an acid generator capable of generating a bulky acid is an effective means for suppressing acid diffusion. It was then proposed to incorporate in a polymer recurring units derived from an onium salt having a polymerizable unsaturated bond as acid generator. Patent Document 1 discloses a sulfonium salt having polymerizable unsaturated bond capable of generating a specific sulfonic acid and a similar iodonium salt. Patent Document 2 discloses a sulfonium salt having sulfonic acid directly attached to the backbone.

Besides the bulky acid generation, another approach for suppressing acid diffusion is also under study. Patent Documents 3 to 8 describe nitrogen-containing adhesive groups. The presence of an electron pair in nitrogen atom is effective for control of acid diffusion. However, nitrogen atom not only retards acid diffusion, but also inhibits acid catalyzed reaction. In such case, deprotection reaction does not take place, or even when deprotection reaction takes place, a slow reaction rate leads to a loss of contrast.

CITATION LIST

Patent Document 1: JP-A 2006-045311 (U.S. Pat. No. 7,482,108)

Patent Document 2: JP-A 2006-178317

Patent Document 3: JP-A 2011-203656

Patent Document 4: WO 2011/024953

Patent Document 5: WO 2012/043102

Patent Document 6: WO 2013/129342

Patent Document 7: JP-A 2012-062371

Patent Document 8: JP-A 2012-197382

Non-Patent Document 1: SPIE Vol. 6520 65203L-1 (2007)

SUMMARY OF INVENTION

An object of the present invention is to provide a resist composition which suppresses acid diffusion, exhibits a high resolution surpassing prior art resist compositions, and forms a pattern of satisfactory profile with low edge roughness (LER, LWR); and a patterning process using the resist composition.

Making extensive investigations in search for a resist material capable of meeting the current requirements including high sensitivity, high resolution, and minimal edge roughness, the inventors have found that better results are obtained by using a polymer comprising recurring units having a succinimide structure as base resin to formulate a resist composition, typically chemically amplified resist composition.

Toward the goals of suppressing acid diffusion and enhancing dissolution contrast, the inventors have further found that when a polymer comprising recurring units having a succinimide structure and recurring units containing a group capable of polarity switch with the aid of acid is used as base resin in a resist composition, typically chemically amplified resist composition, the resulting resist composition exhibits a high sensitivity, a very high contrast of alkaline dissolution rate before and after exposure, full suppression of acid diffusion, and high resolution, and forms a pattern of satisfactory profile with minimal edge roughness. The resist composition is best suited as the fine pattern-forming material for the manufacture of VLSIs and photomasks.

Since the resist composition allows an acid generator to be effectively decomposed, it has many advantages including a high sensitivity, full suppression of acid diffusion, high resolution, minimal edge roughness, process adaptability, and a good pattern profile after exposure. Because of these advantages, the resist composition is fully useful in commercial application and best suited as the fine pattern-forming material for the manufacture of VLSIs and masks.

In one aspect, the invention provides a resist composition comprising as base resin a polymer comprising recurring units represented by the formula (a) and recurring units containing a group capable of polarity switch with the aid of acid, the polymer having a weight average molecular weight of 1,000 to 500,000.

(a)

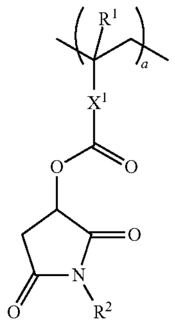

Herein $R^1$ is hydrogen or methyl, $R^2$ is hydrogen, a $C_1$-$C_8$ straight, branched or cyclic alkyl group, $C_2$-$C_6$ straight, branched or cyclic acyl group, or $C_2$-$C_6$ straight, branched or cyclic alkoxycarbonyl group, $X^1$ is a single bond, phenylene group, naphthylene group, or $C_1$-$C_{12}$ linking group containing an ester moiety, ether moiety or lactone ring, and a is a positive number in the range: $0<a<1.0$.

In a preferred embodiment, the polarity switch with the aid of acid is due to elimination reaction.

In a preferred embodiment, the recurring unit containing a group capable of polarity switch with the aid of acid contains a carboxyl or phenolic hydroxyl group substituted with an acid labile group.

In a preferred embodiment, the recurring unit containing a group capable of polarity switch with the aid of acid has the formula (b1) or (b2).

(b1)

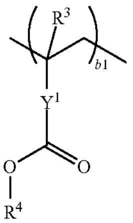

-continued (b2)

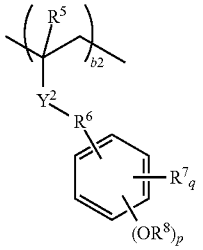

Herein $R^3$ and $R^5$ are each independently hydrogen or methyl, $R^4$ and $R^8$ are each independently an acid labile group, $R^6$ is a single bond or a $C_1$-$C_6$ straight or branched alkylene group, $R^7$ is hydrogen, fluorine, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group, p is 1 or 2, q is an integer of 0 to 4, $Y^1$ is a single bond, phenylene group, naphthylene group, or a $C_1$-$C_{12}$ linking group containing an ester moiety, ether moiety or lactone ring, $Y^2$ is a single bond, —C(═O)—O— or —C(═O)—NH—, b1 and b2 are numbers in the range: $0 \leq b1<1.0$, $0 \leq b2<1.0$, and $0<b1+b2<1.0$.

In a preferred embodiment, the recurring unit containing a group capable of polarity switch with the aid of acid is a recurring unit which switches from hydrophilic to hydrophobic due to dehydration reaction with the aid of acid.

In a preferred embodiment, the recurring unit containing a group capable of polarity switch with the aid of acid is derived from a monomer selected from the following monomers.

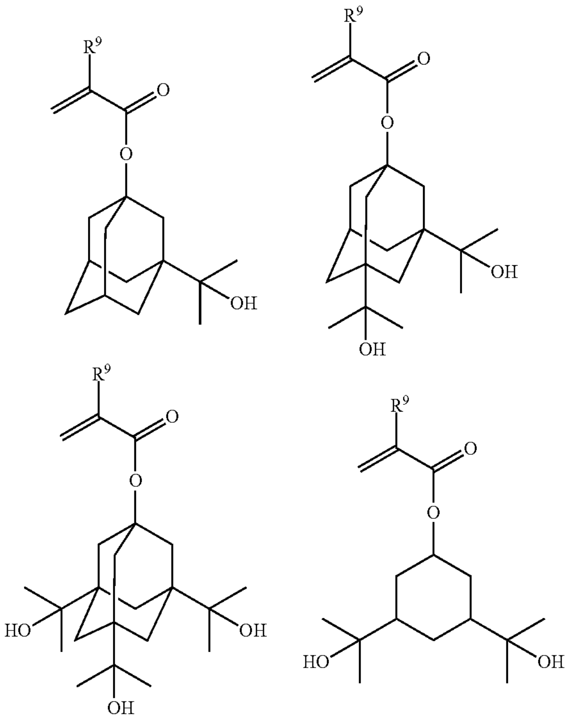

-continued

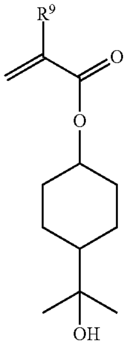
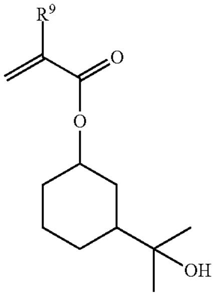
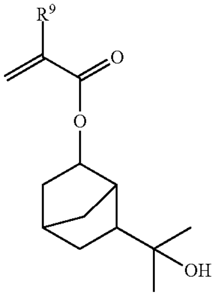
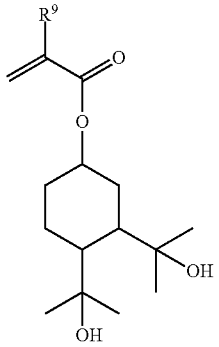
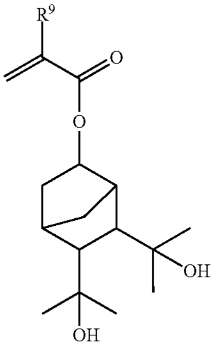
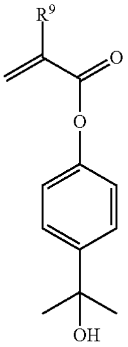
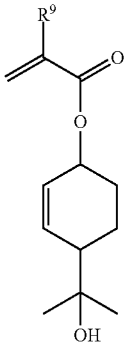
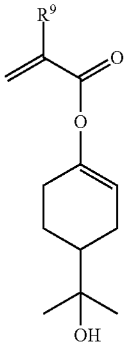
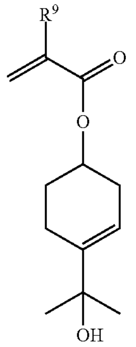
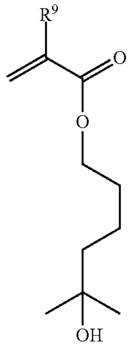

Herein $R^9$ is hydrogen or methyl.

In a preferred embodiment, the polymer further comprises recurring units having an adhesive group selected from the group consisting of hydroxyl, carboxyl, lactone ring, carbonate, thiocarbonate, carbonyl, cyclic acetal, ether, ester, sulfonic acid ester, cyano, amide, and —O—C(=O)-G- wherein G is —S— or —NH—.

In a preferred embodiment, the polymer further comprises recurring units of at least one type selected from recurring units represented by the formulae (d1) to (d3).

(d1)

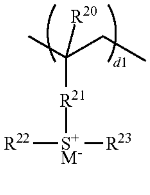

-continued (d2)

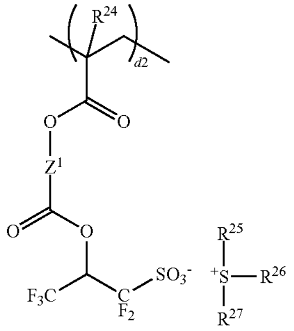

(d3)

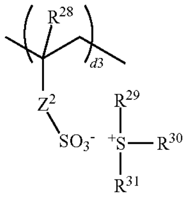

Herein $R^{20}$, $R^{24}$, and $R^{26}$ are each independently hydrogen or methyl, $R^{21}$ is a single bond, phenylene, —O—$R^A$—, or —C(=O)—$Y^0$—$R^A$—, $Y^0$ is —O— or —NH—, $R^A$ is a $C_1$-$C_6$ straight, branched or cyclic alkylene or $C_2$-$C_6$ straight, branched or cyclic alkenylene group which may contain a carbonyl, ester, ether or hydroxyl moiety, or phenylene group, $R^{22}$, $R^{23}$, $R^{25}$, $R^{26}$, $R^{27}$, $R^{29}$, $R^{30}$, and $R^{31}$ are each independently a $C_1$-$C_{12}$ straight, branched or cyclic alkyl group which may contain a carbonyl, ester, ether or hydroxyl moiety, or a $C_6$-$C_{12}$ aryl, $C_7$-$C_{20}$ aralkyl, or mercaptophenyl group, $Z^1$ is a single bond, a $C_1$-$C_{12}$ straight, branched or cyclic alkylene or $C_2$-$C_{12}$ straight, branched or cyclic alkenylene group which may contain an ether moiety, ester moiety or lactone ring, or $C_6$-$C_{10}$ arylene group, $Z^2$ is a single bond, methylene, ethylene, phenylene, fluorinated phenylene, —O—$R^{32}$—, or —C(=O)—$Z^3$—$R^{32}$—, $Z^3$ is —O— or —NH—, $R^{32}$ is a $C_1$-$C_{12}$ straight, branched or cyclic alkylene or $C_2$-$C_{12}$ alkenylene group which may contain a carbonyl, ester, ether or hydroxyl moiety, or phenylene group, $M^-$ is a non-nucleophilic counter ion, d1, d2 and d3 are numbers in the range: $0 \le d1 \le 0.5$, $0 \le d2 \le 0.5$, $0 \le d3 \le 0.5$, and $0 < d1+d2+d3 \le 0.5$.

The resist composition may further comprise an acid generator, an organic solvent, optionally a basic compound and/or a surfactant.

In another aspect, the invention provides a pattern forming process comprising the steps of applying the resist composition defined above onto a substrate to form a coating, baking, exposing the coating to high-energy radiation, and developing the exposed coating in a developer.

Typically, the high-energy radiation is i-line, KrF excimer laser, ArF excimer laser, EB or EUV of wavelength 3 to 15 nm.

The resist composition, typically chemically amplified resist composition is used not only in the lithography for forming semiconductor circuits, but also in the formation of mask circuit patterns, micromachines, and thin-film magnetic head circuits.

ADVANTAGEOUS EFFECTS OF INVENTION

The resist composition is effective for suppressing acid diffusion, exhibits a high resolution, and forms a pattern of satisfactory profile with minimal edge roughness after exposure. Because of these advantages, the resist composition is best suited as a fine pattern-forming material for the manufacture of VLSIs and photomasks and a pattern-forming material for lithography using i-line, KrF excimer laser, ArF excimer laser, EB or EUV.

DESCRIPTION OF EMBODIMENTS

The singular forms "a," "an" and "the" include plural referents unless the context clearly dictates otherwise. The notation (Cn-Cm) means a group containing from n to m carbon atoms per group. In the chemical formula, the broken line designates a valence bond, Me is methyl, Ac is acetyl, and Ph is phenyl.

The abbreviations have the following meaning.

EB: electron beam

EUV: extreme ultraviolet

PAG: photoacid generator

PEB: post-exposure bake

LER: line edge roughness

LWR: line width roughness

Mw: weight average molecular weight

Mw/Mn: molecular weight distribution or dispersity

GPC: gel permeation chromatography

Resist Composition

Base Resin

A first embodiment of the invention is a resist composition comprising as base resin a polymer comprising recurring units represented by the formula (a), also referred to as recurring units (a), and recurring units containing a group capable of polarity switch with the aid of acid. The polymer is referred to as "polymer A," hereinafter.

(a)

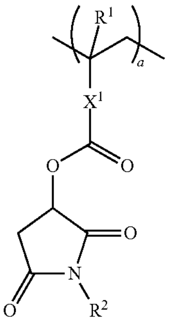

Herein $R^1$ is hydrogen or methyl. $R^2$ is hydrogen, a $C_1$-$C_8$ straight, branched or cyclic alkyl group, $C_2$-$C_6$ straight, branched or cyclic acyl group, or $C_2$-$C_6$ straight, branched or cyclic alkoxycarbonyl group. $X^1$ is a single bond, phenylene group, naphthylene group, or $C_1$-$C_{12}$ linking group containing an ester moiety, ether moiety or lactone ring, and a is a positive number in the range: $0<a<1.0$.

Monomers Ma from which recurring units (a) are derived include those represented by the formula (Ma).

(Ma)

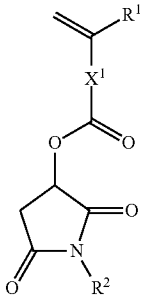

Herein $R^1$, $R^2$ and $X^1$ are as defined above.

The monomer Ma may be synthesized, for example, by reaction of a compound having the formula (a1) with a compound having the formula (a2).

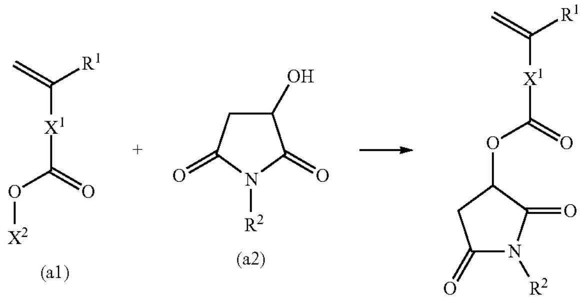

(a1) (a2) (Ma)

In the formulae, $R^1$, $R^2$ and $X^1$ are as defined above. $X^2$ is hydrogen, halogen such as chlorine or bromine, or a group of the following formula (a3):

(a3)

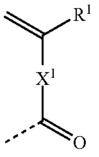

wherein $R^1$ and $X^1$ are as defined above.

Examples of the monomer Ma are shown below, but not limited thereto. Herein $R^1$ is as defined above.

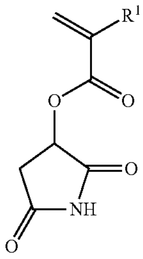
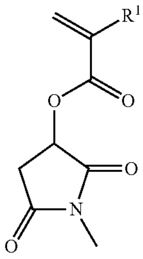
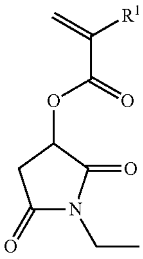

-continued
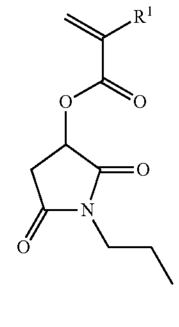
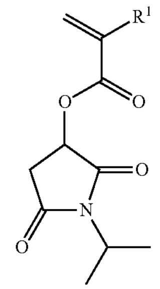
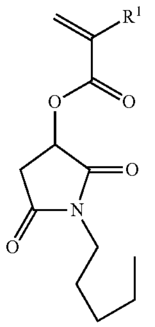
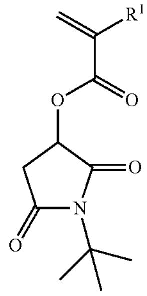
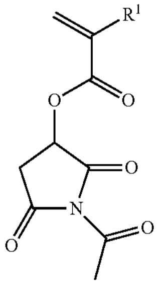
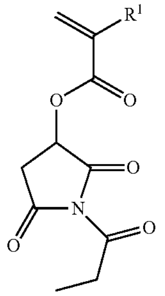
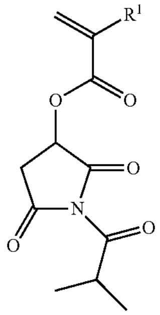
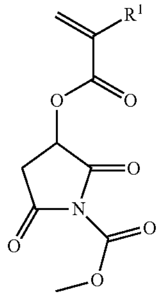
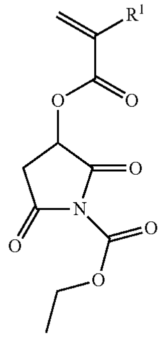
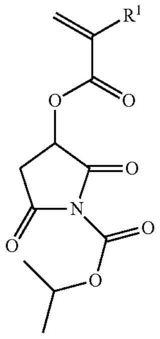
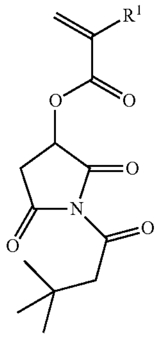
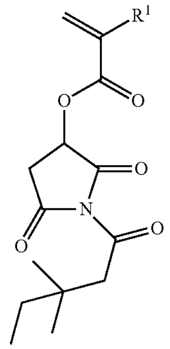
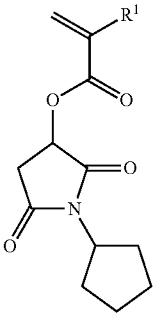
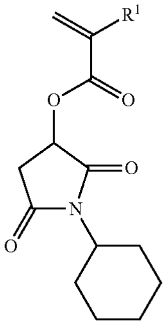
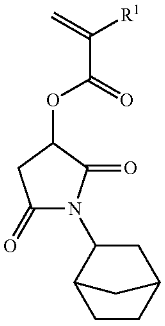
-continued
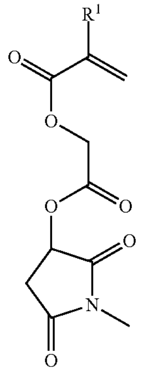
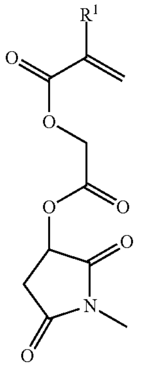
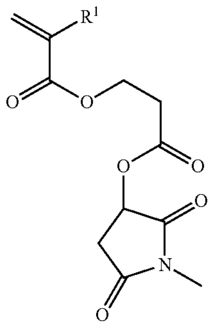
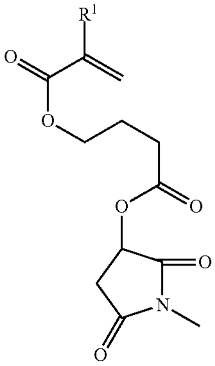
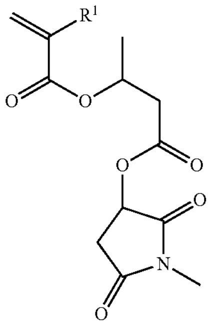
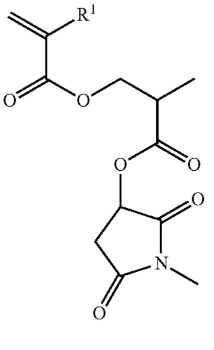
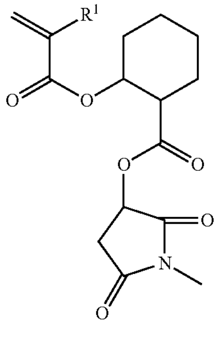
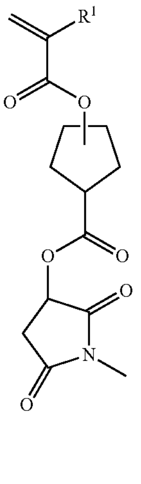
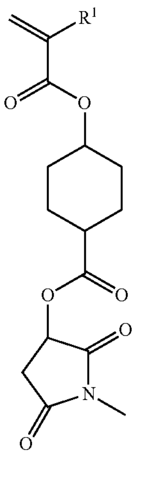
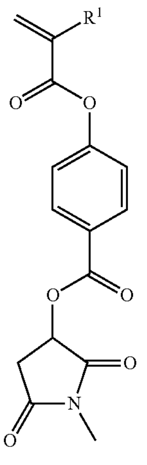

-continued
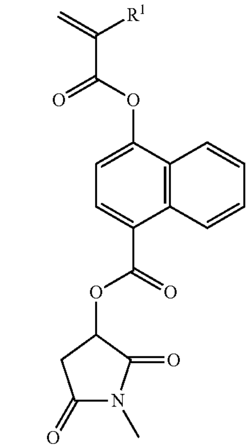
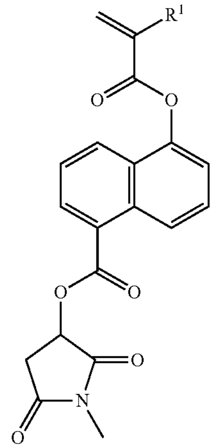
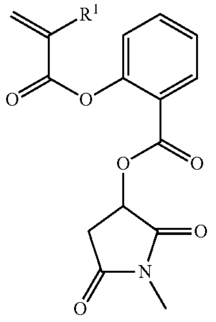
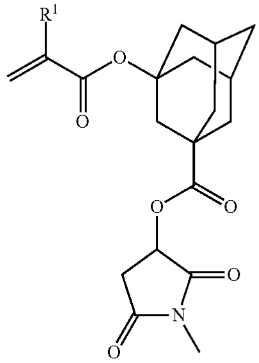
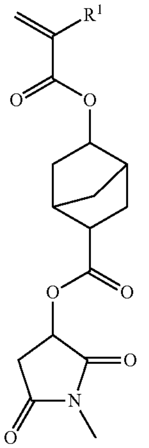
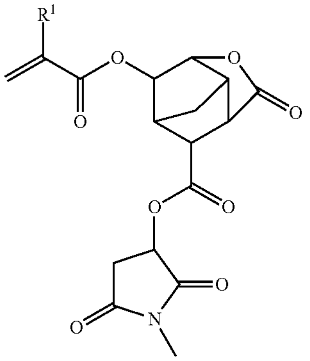
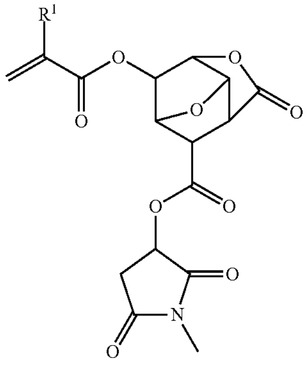
-continued
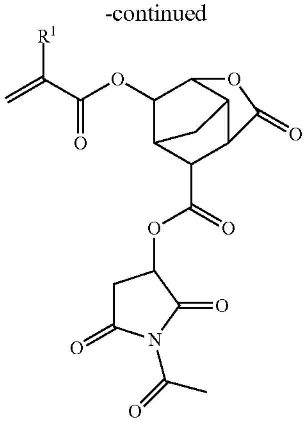
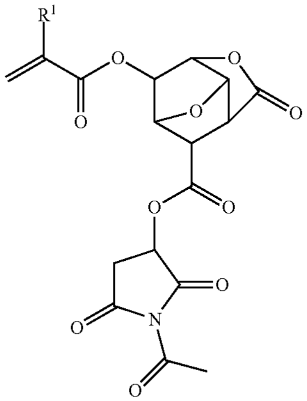
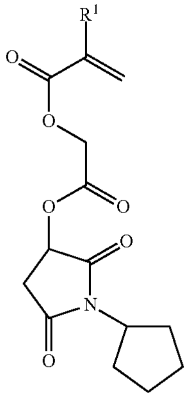
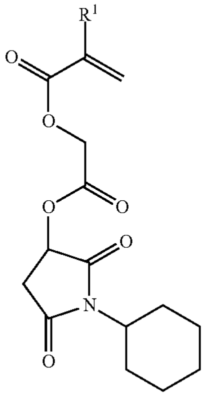
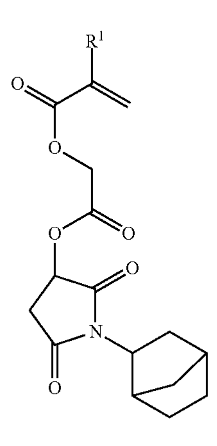
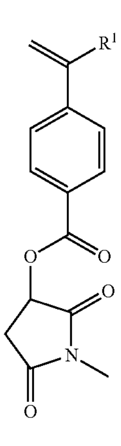
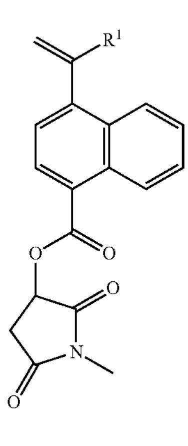

-continued

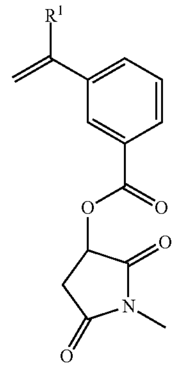

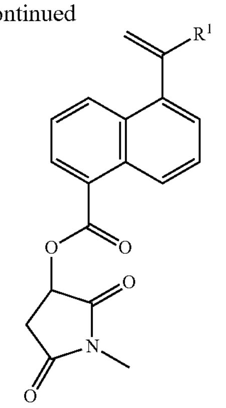

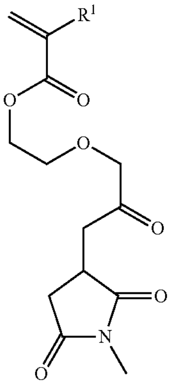

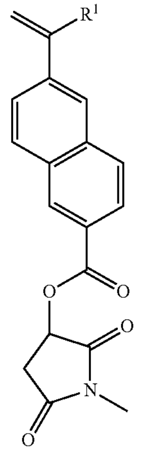

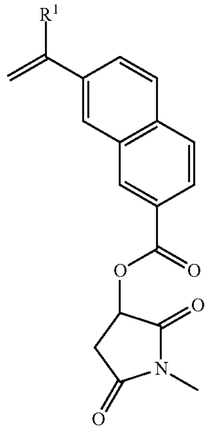

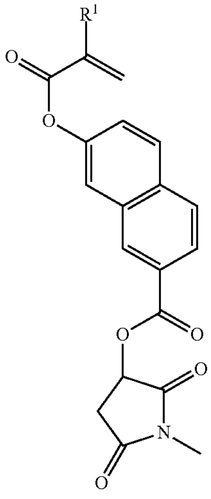

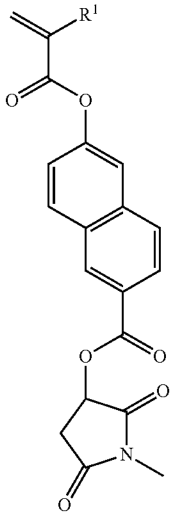

The recurring unit (a) is characterized by inclusion of a succinimide structure. While the amide or carbamate group containing both nitrogen and oxygen atoms has the drawback that deprotection reaction is inhibited due to an extreme effect of suppressing acid diffusion, the succinimide structure does not inhibit acid-catalyzed deprotection reaction because the presence of two carbonyl groups around the nitrogen atom prevents the nitrogen atom from exerting basicity. Yet, the unpaired electron in the nitrogen atom is highly effective for suppressing acid diffusion. Three carbonyl groups provide for adhesion, and the unpaired electron in the nitrogen atom suppresses acid diffusion. As a result, pattern collapse is prevented and edge roughness (LWR) is mitigated.

The recurring units containing a group capable of polarity switch with the aid of acid, referred to as recurring units (b), hereinafter, are typically recurring units containing a carboxyl or phenolic hydroxyl group substituted with an acid labile group. The preferred recurring units include recurring units having the formula (b1) and recurring units having the formula (b2). Notably, these units are also referred to as recurring units (b1) and (b2). When recurring units (b1) and/or (b2) are used, the resist composition of the invention may be used either as a positive resist composition adapted to form a positive pattern via alkaline development or as a negative resist composition adapted to form a negative pattern via organic solvent development.

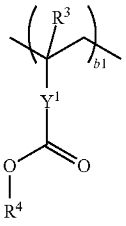

(b1)

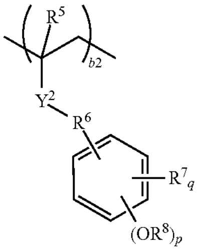

(b2)

Herein $R^3$ and $R^5$ are each independently hydrogen or methyl. $R^4$ and $R^8$ are each independently an acid labile group. $R^6$ is a single bond or a $C_1$-$C_6$ straight or branched alkylene group. $R^7$ is hydrogen, fluorine, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group, p is 1 or 2, q is an integer of 0 to 4. $Y^1$ is a single bond, phenylene group, naphthylene group, or a $C_1$-$C_{12}$ linking group containing an ester moiety, ether moiety or lactone ring. $Y^2$ is a single bond, —C(═O)—O— or —C(═O)—NH—, b1 and b2 are numbers in the range: $0 \leq b1 < 1.0$, $0 \leq b2 < 1.0$, and $0 < b1+b2 < 1.0$.

The monomer Mb1 from which recurring unit (b1) is derived has the formula (Mb1), and the monomer Mb2 from which recurring unit (b2) is derived has the formula (Mb2).

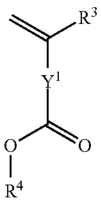

(Mb1)

-continued
(Mb2)
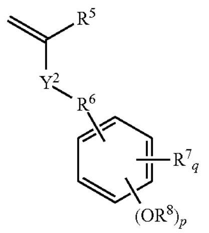
Herein $R^3$ to $R^8$, $Y^1$, $Y^2$, p and q are as defined above.
Of the groups $Y^1$, the $C_1$-$C_{12}$ linking group containing lactone ring is exemplified below.
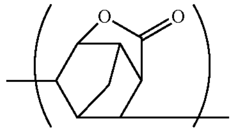
Examples of the monomer Mb1 are given below, but not limited thereto. $R^3$ and $R^4$ are as defined above.
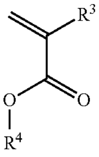
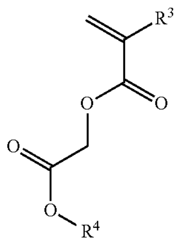
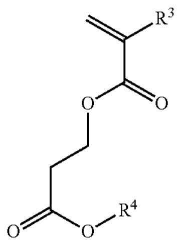
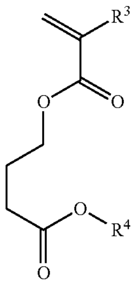
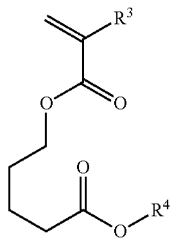
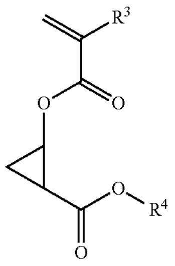
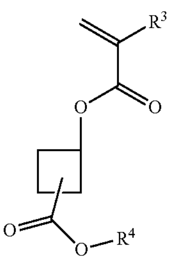
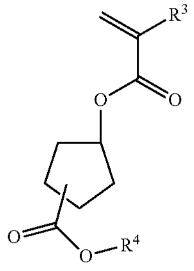
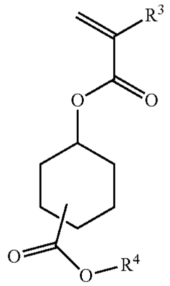
-continued
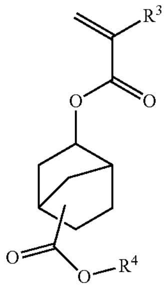
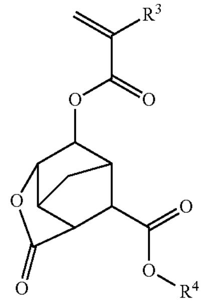
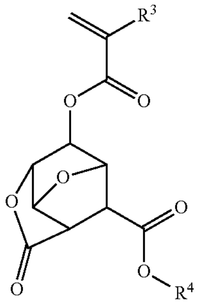
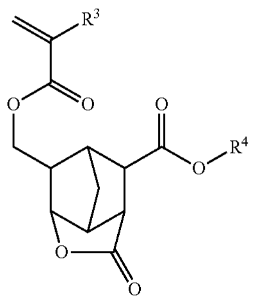
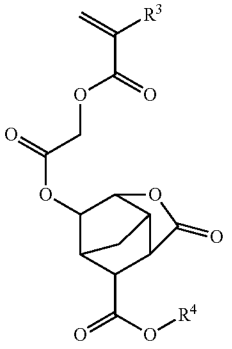
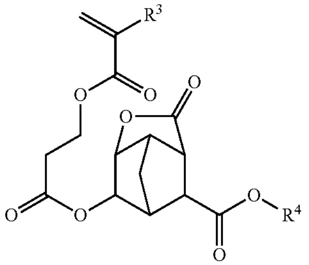
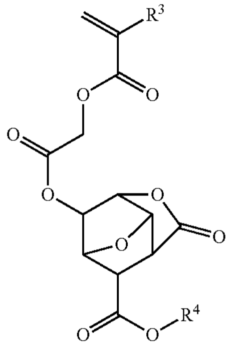
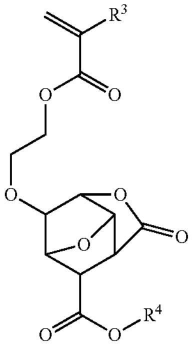

-continued
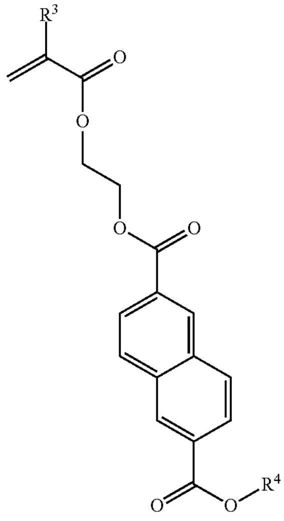
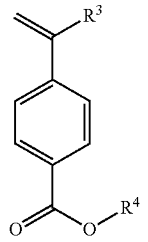
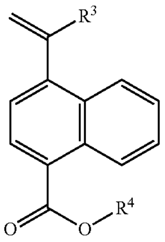
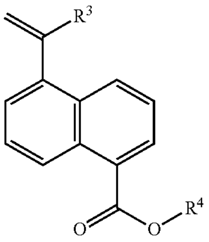
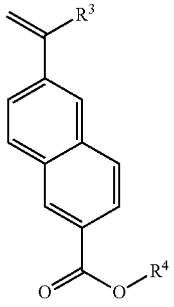
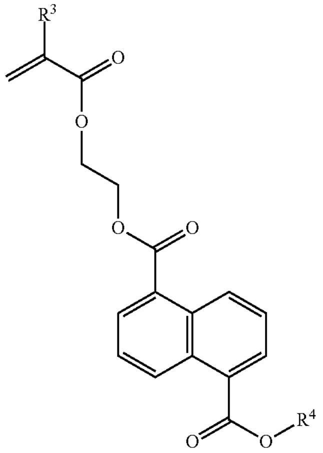
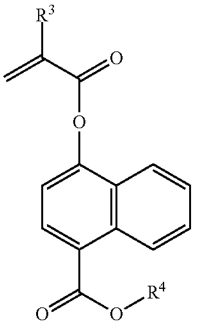
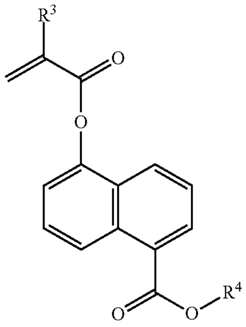
-continued
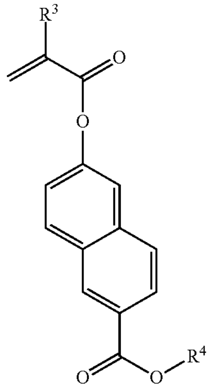
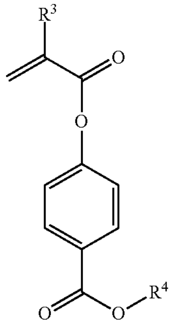
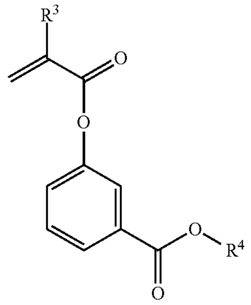
Examples of the monomer Mb2 are given below, but not limited thereto. $R^5$ and $R^8$ are as defined above.
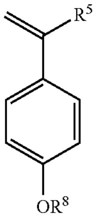
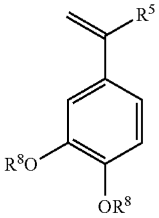
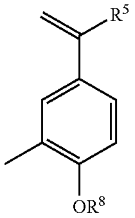
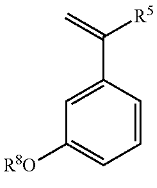
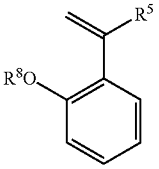
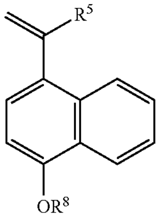
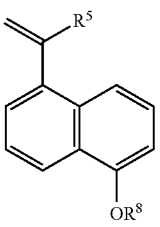
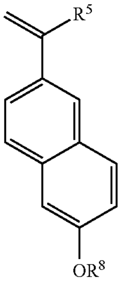
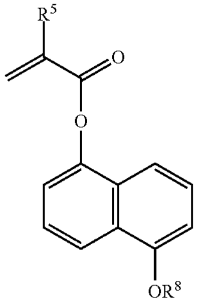

-continued

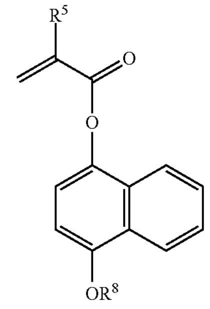

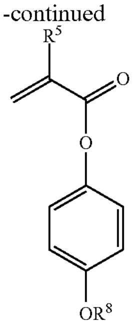

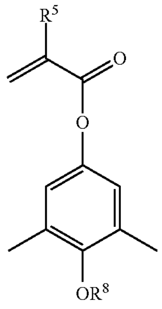

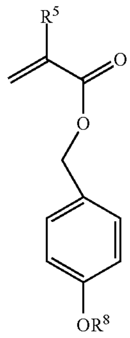

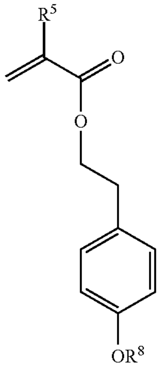

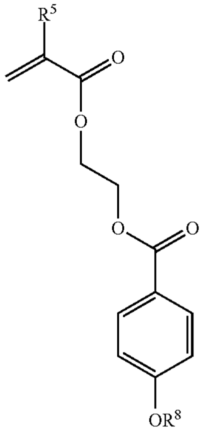

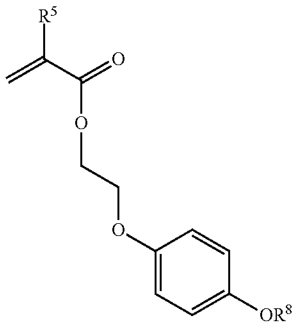

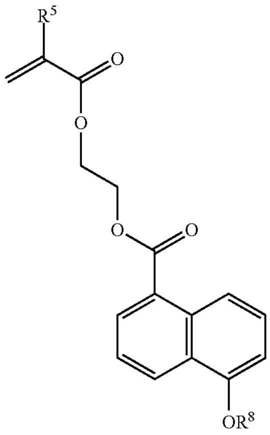

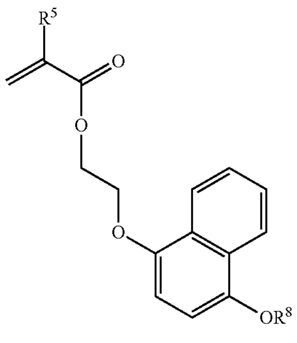

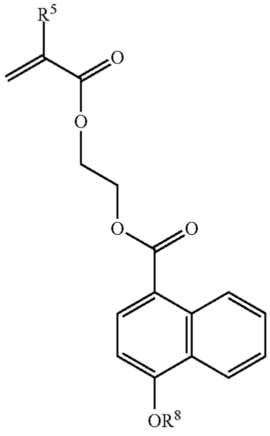

-continued

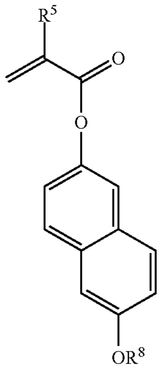

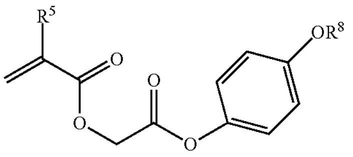

In formulae (b1) and (b2), the acid labile groups represented by $R^4$ and $R^8$ may be selected from a variety of such groups. The acid labile groups may be the same or different and selected from the acid labile groups described in U.S. Pat. No. 8,574,817 (JP-A 2013-080033) and U.S. Pat. No. 8,846,301 (JP-A 2013-083821), for example. Those groups of the formulae (AL-10) to (AL-12) are typical.

(AL-10)

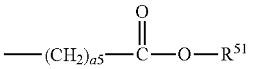

(AL-11)

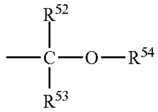

(AL-12)

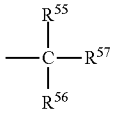

Herein $R^{51}$ and $R^{54}$ are each independently a $C_1$-$C_{40}$, especially $C_1$-$C_{20}$ monovalent hydrocarbon group, typically straight, branched or cyclic alkyl group, which may contain a heteroatom such as oxygen, sulfur, nitrogen or fluorine. $R^{52}$ and $R^{53}$ are each independently hydrogen, or a $C_1$-$C_{20}$ monovalent hydrocarbon group, typically straight, branched or cyclic alkyl group, which may contain a heteroatom such as oxygen, sulfur, nitrogen or fluorine, a5 is an integer of 0 to 10, preferably 1 to 5. A pair of $R^{52}$ and $R^{53}$, $R^{52}$ and $R^{54}$, or $R^{53}$ and $R^{54}$ may bond together to form a $C_3$-$C_{20}$, especially $C_4$-$C_{16}$ ring, preferably alicyclic ring with the carbon atom or the carbon and oxygen atoms to which they are attached. $R^{55}$, $R^{56}$ and $R^{57}$ are each independently a $C_1$-$C_{20}$ monovalent hydrocarbon group, typically straight, branched or cyclic alkyl group, which may contain a heteroatom such as oxygen, sulfur, nitrogen or fluorine. A pair of $R^{55}$ and $R^{56}$, $R^{55}$ and $R^{57}$, or $R^{56}$ and $R^{57}$ may bond together to form a $C_3$-$C_{20}$, especially $C_4$-$C_{16}$ ring, preferably alicyclic ring with the carbon atom to which they are attached.

As the recurring units (b), recurring units which switch from hydrophilic to hydrophobic due to dehydration reaction with the aid of acid, referred to as recurring units (b3), may also be used. When recurring units (b3) are used, the resist composition of the invention may be used as a negative resist composition adapted to form a negative pattern via alkaline development.

Examples of the monomer from which recurring units (b3) are derived are given below, but not limited thereto. Herein $R^9$ is hydrogen or methyl.

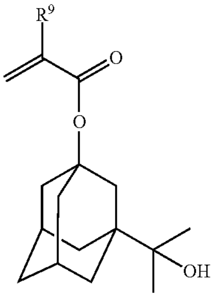
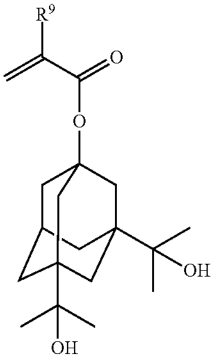
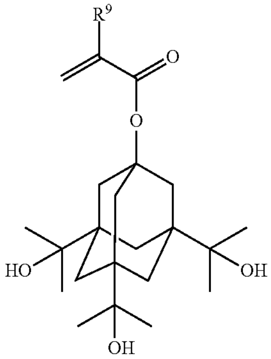
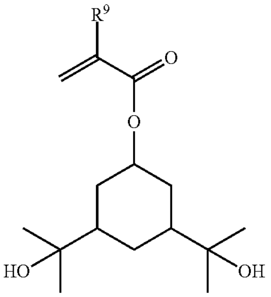
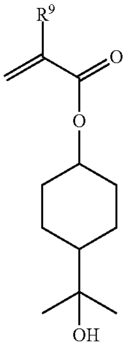
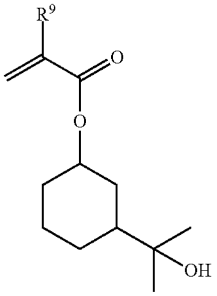
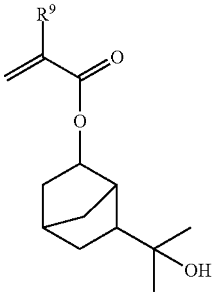
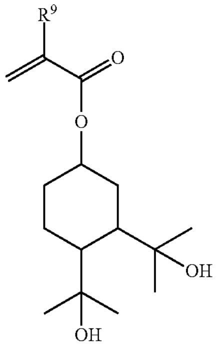
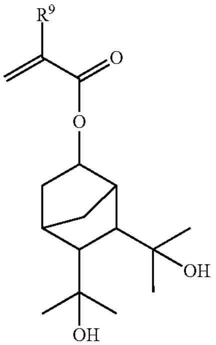
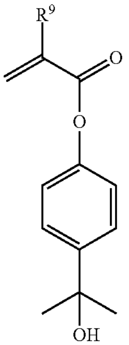

-continued

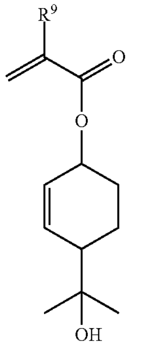
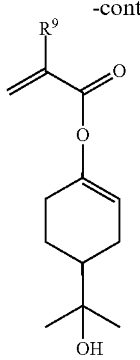
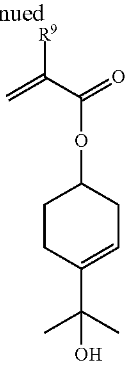
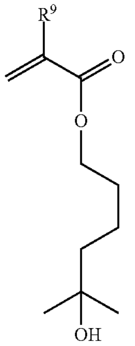

In a preferred embodiment, polymer A may further comprise recurring units (c) having an adhesive group. The adhesive group is selected from among hydroxyl, carboxyl, lactone ring, carbonate, thiocarbonate, carbonyl, cyclic acetal, ether, ester, sulfonic acid ester, cyano, amide, and —O—C(═O)-G- wherein G is —S— or —NH—. Examples of the monomer from which the recurring units (c) are derived are shown below, but not limited thereto.

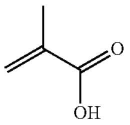
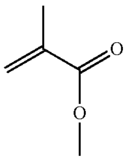
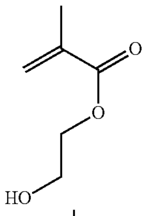
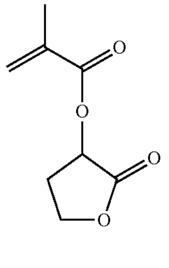
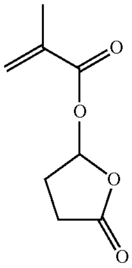
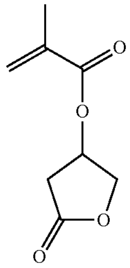
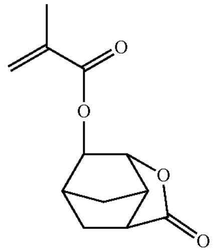
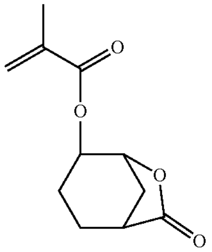
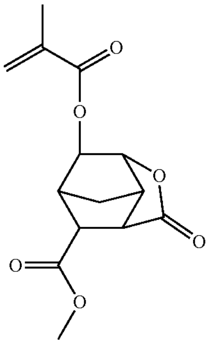
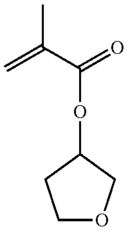
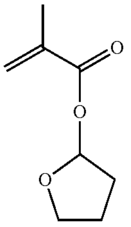

-continued
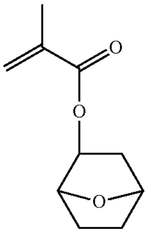
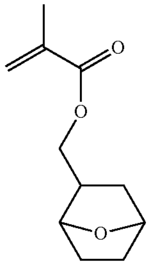
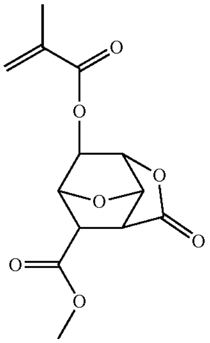
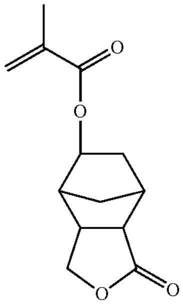
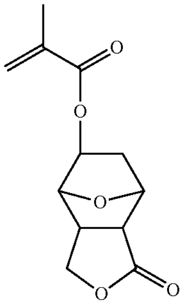
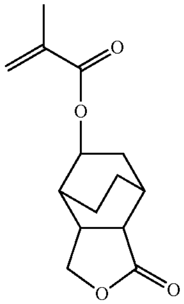
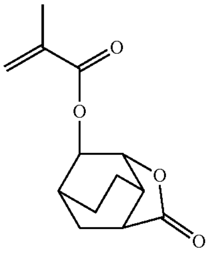
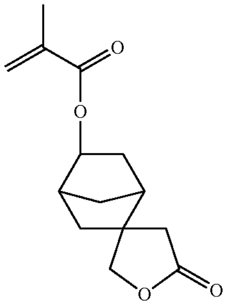
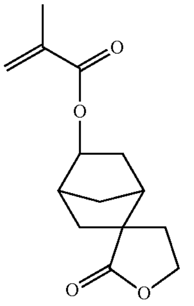
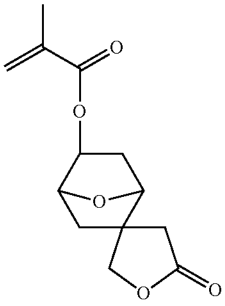
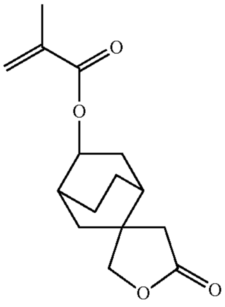
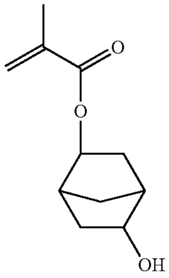
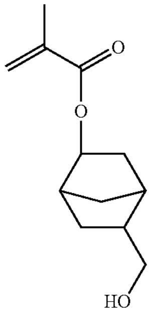
-continued
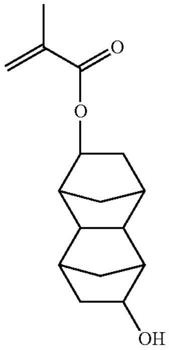
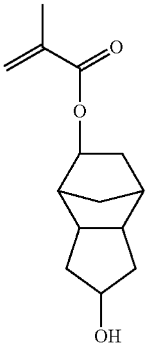
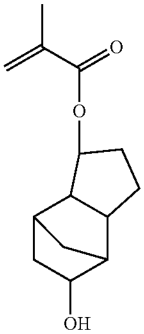
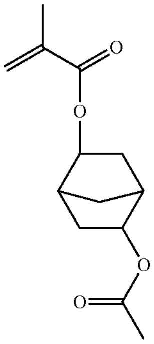
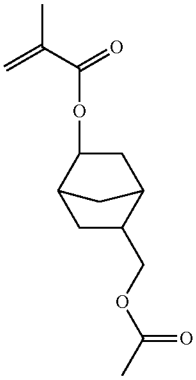
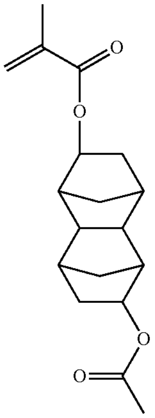
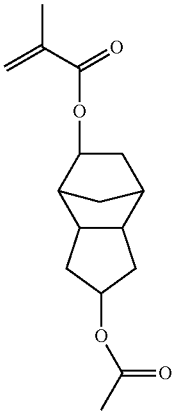
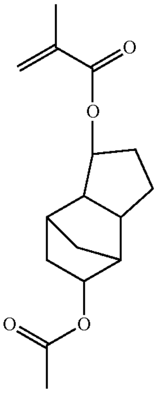
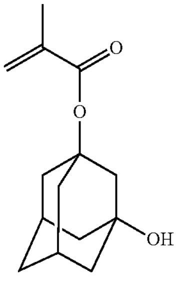
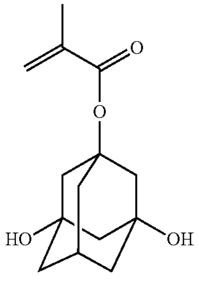

-continued
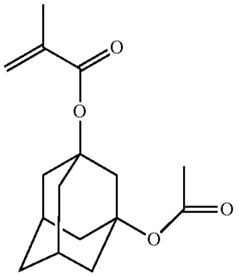
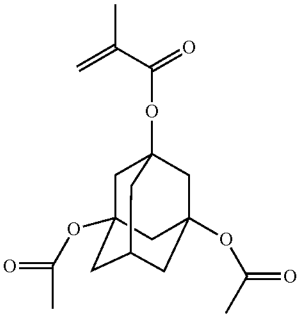
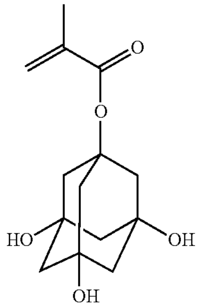
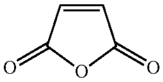
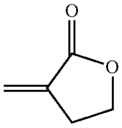
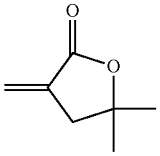
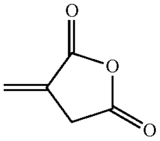
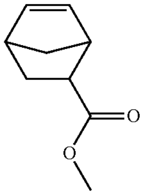
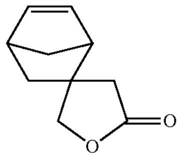
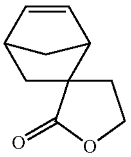
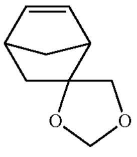
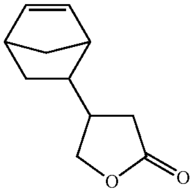
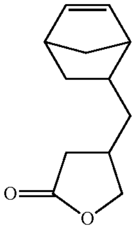
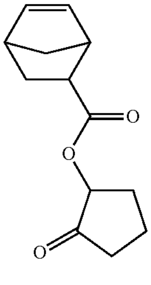
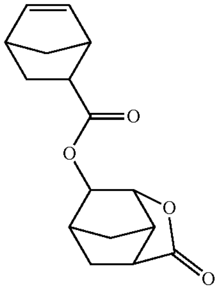
-continued
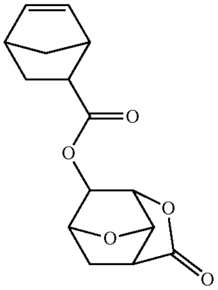
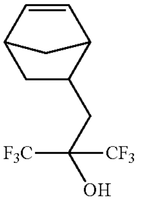
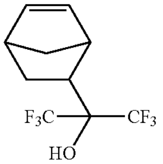
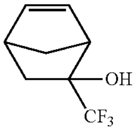
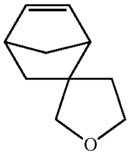
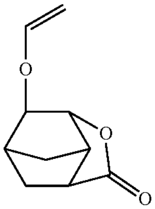
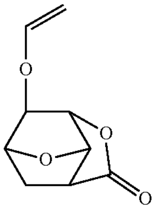
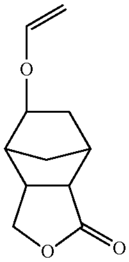
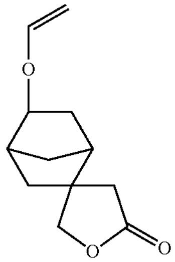
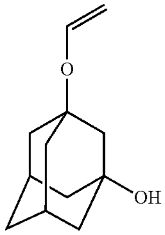
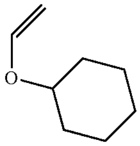
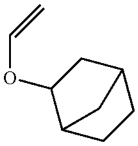
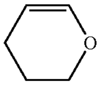
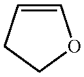
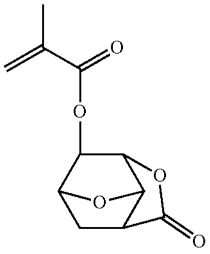
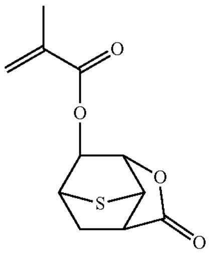
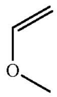
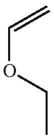
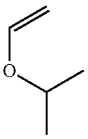

-continued
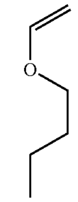
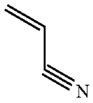
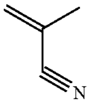
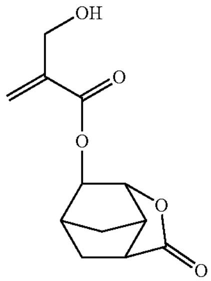
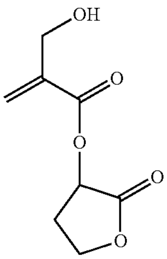
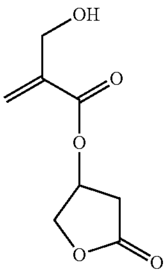
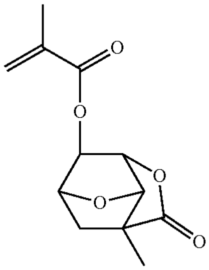
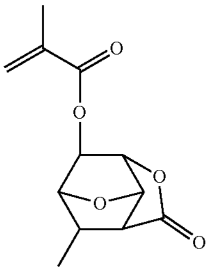
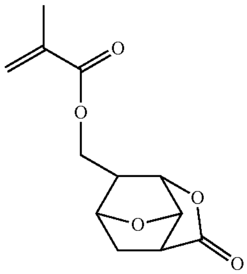
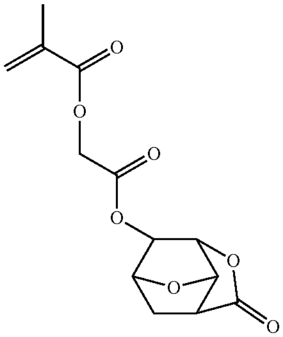
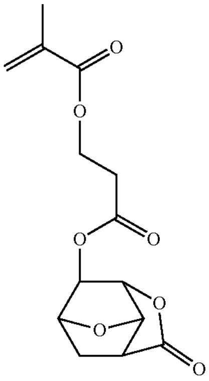
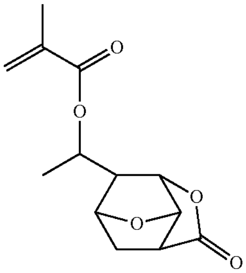
-continued
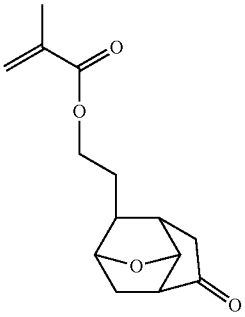
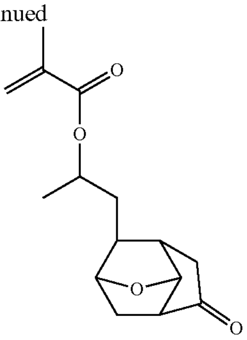
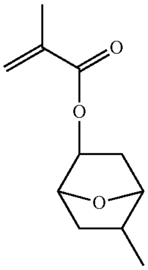
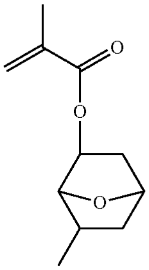
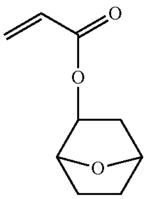
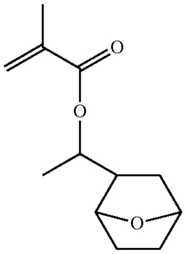
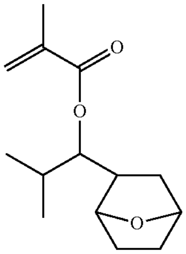
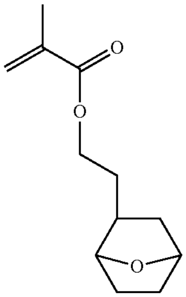
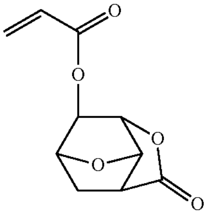
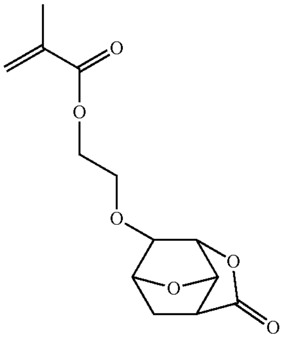
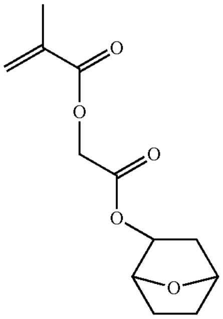

-continued
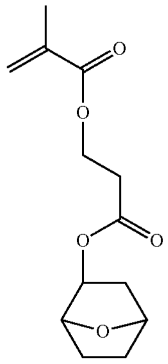
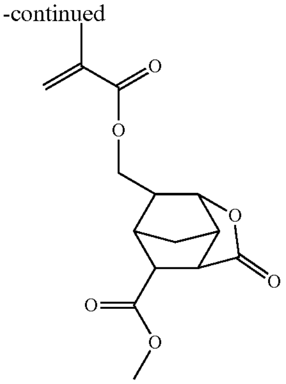
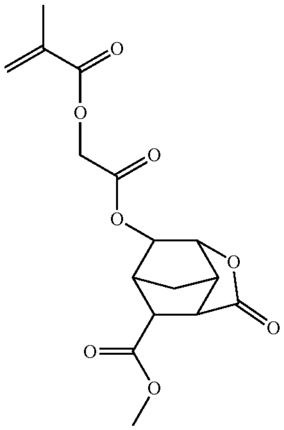
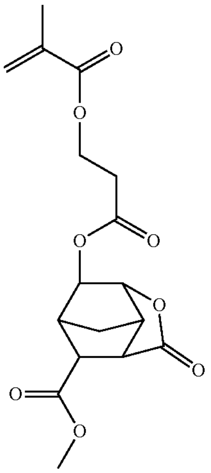
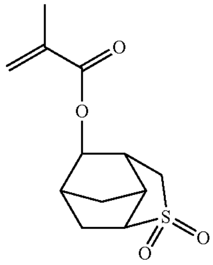
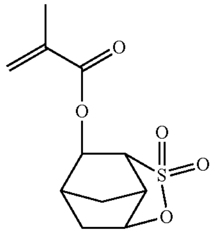
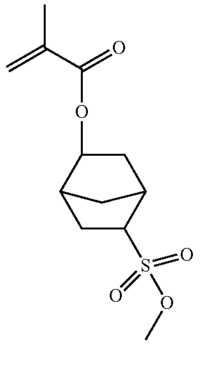
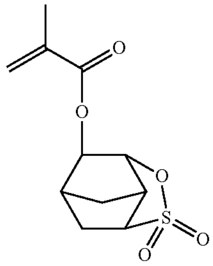
-continued
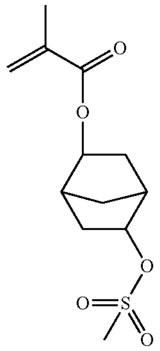
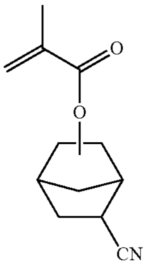
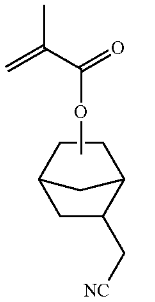
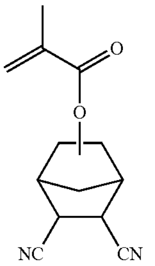
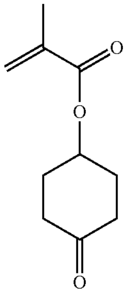
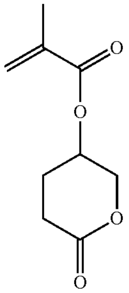
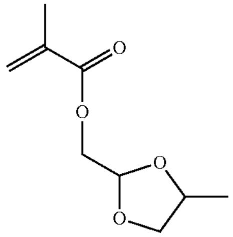
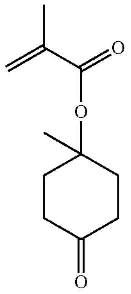
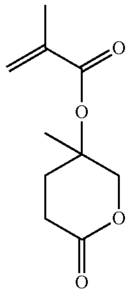
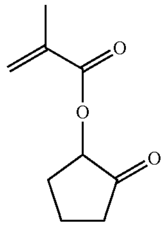
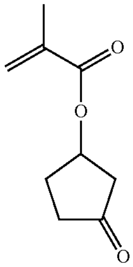
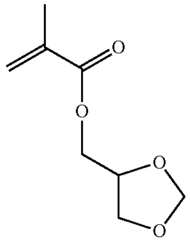

-continued
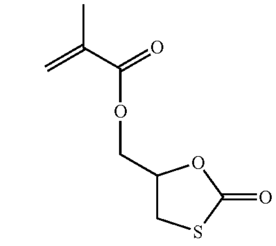
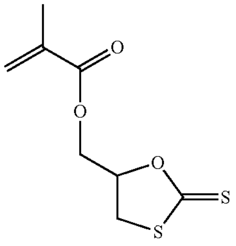
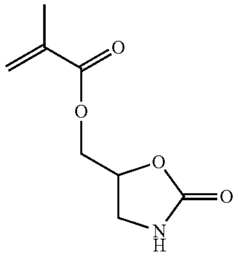
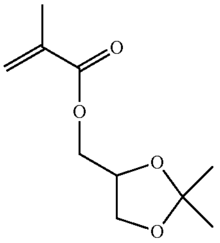
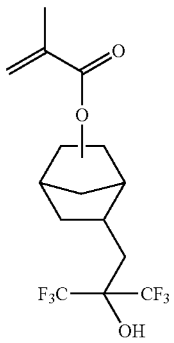
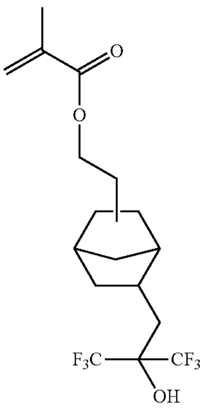
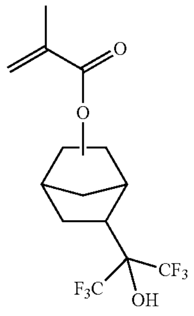
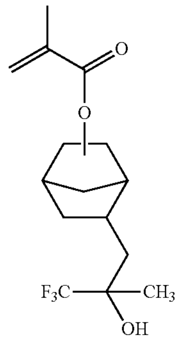
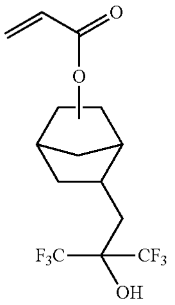
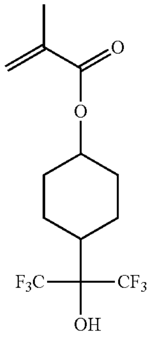
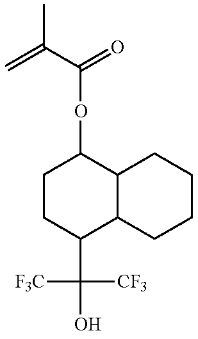
-continued
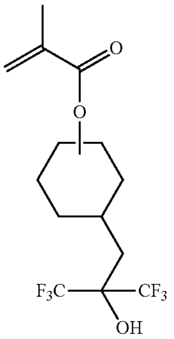
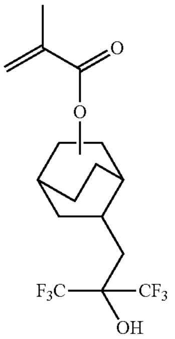
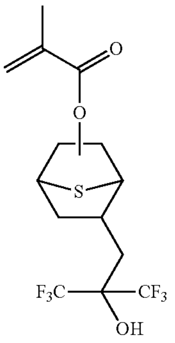
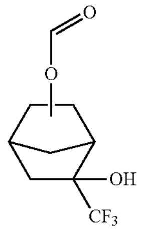
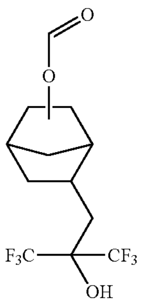
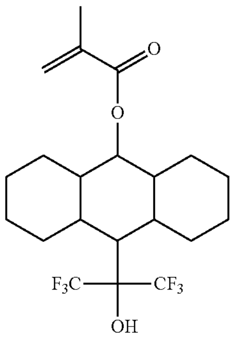
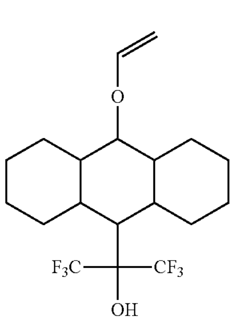
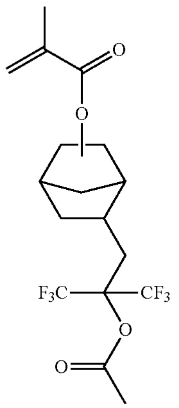

-continued
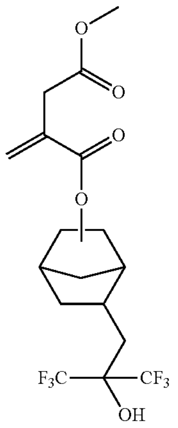
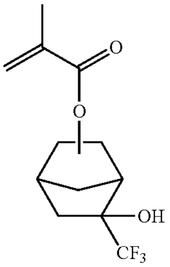
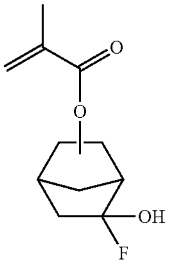
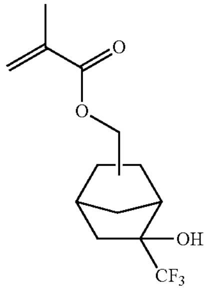
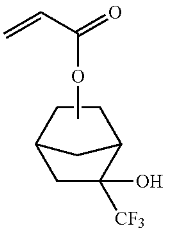
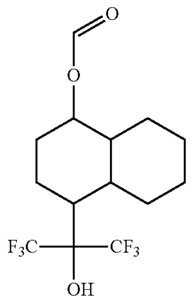
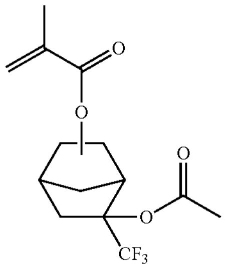
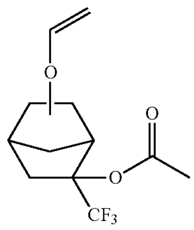
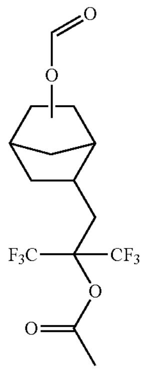
-continued
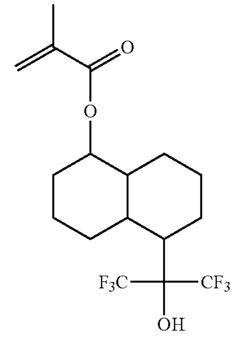
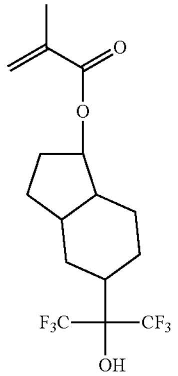
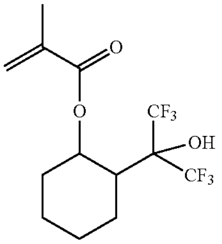
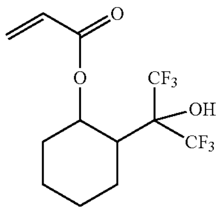
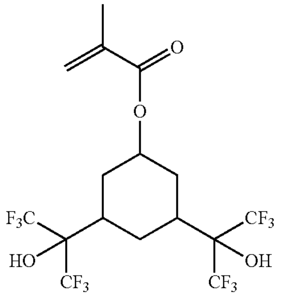
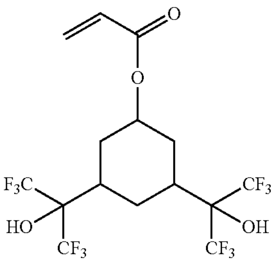
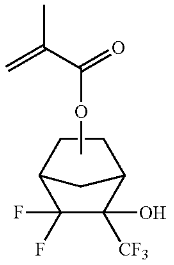
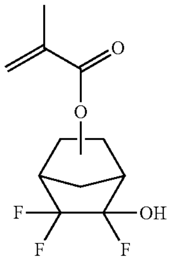
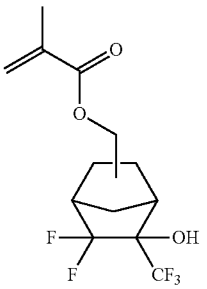
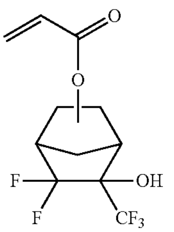
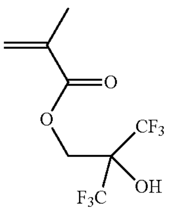
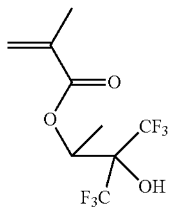
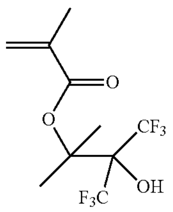

-continued
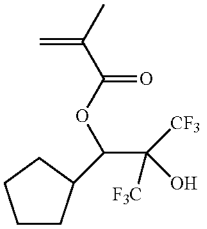
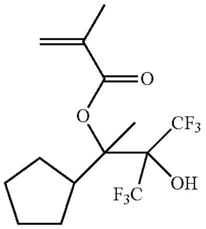
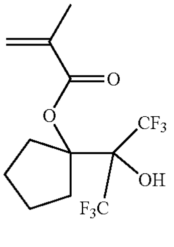
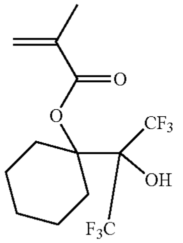
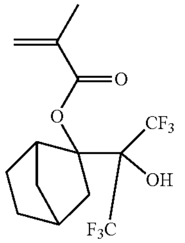
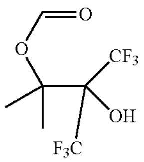
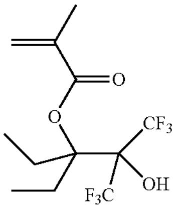
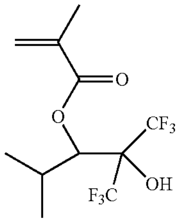
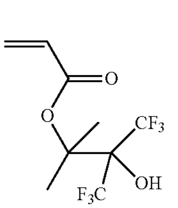
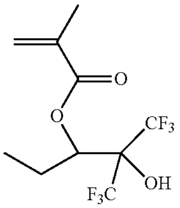
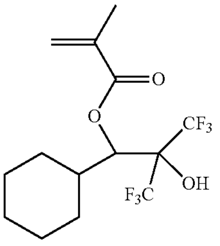
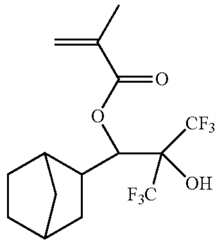
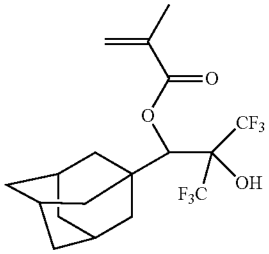
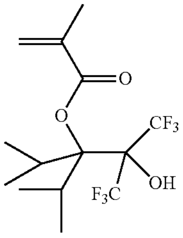
-continued
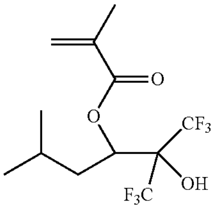
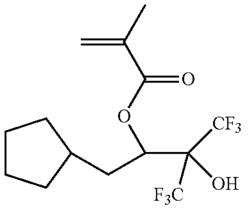
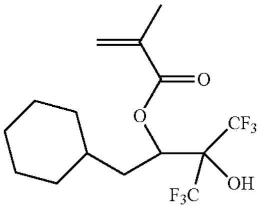
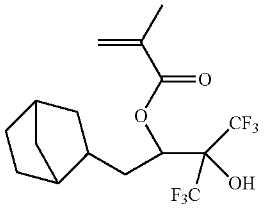
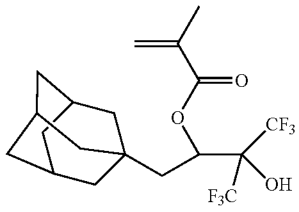
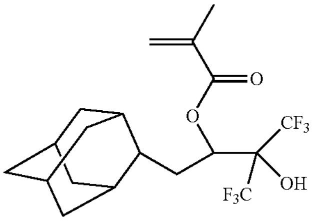
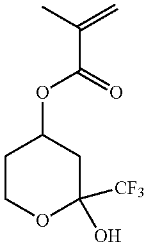
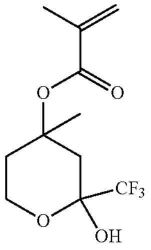
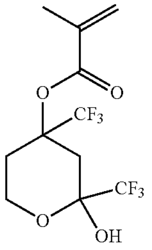
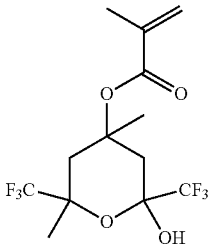
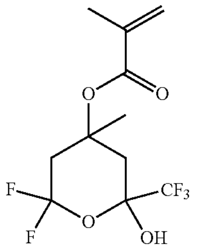
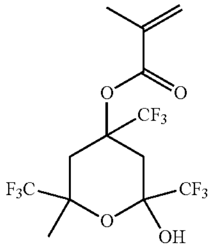
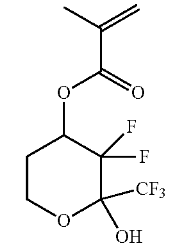

-continued
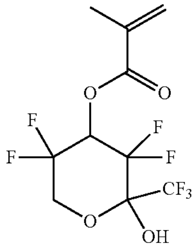
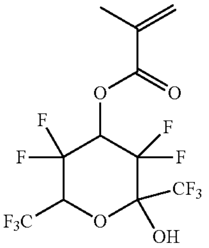
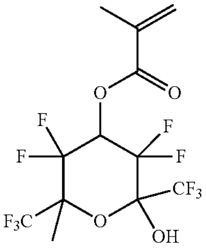
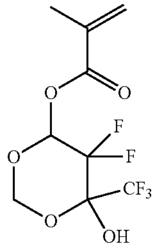
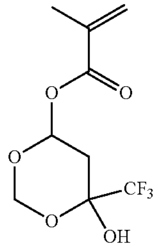
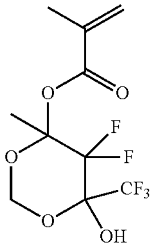
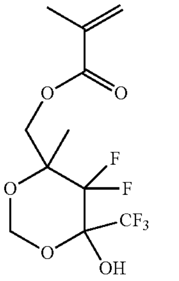
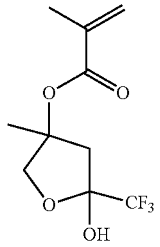
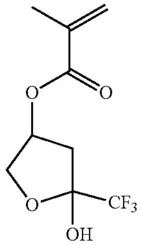
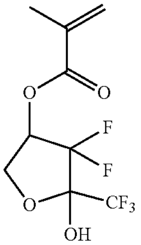
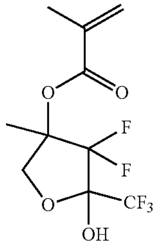
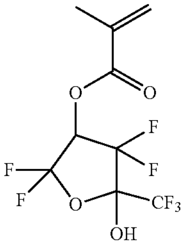
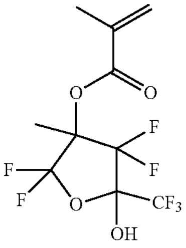
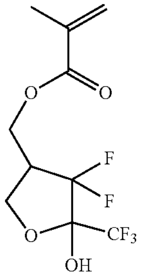
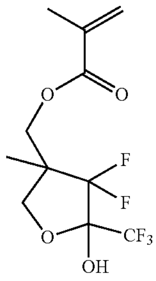
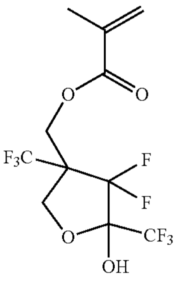
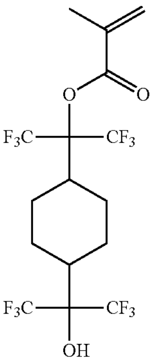
-continued
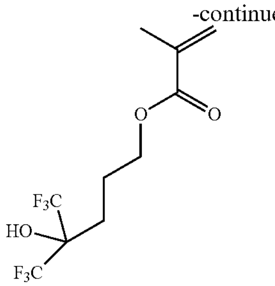
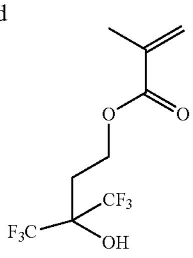
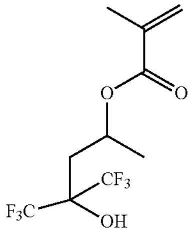
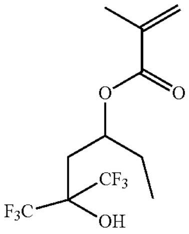
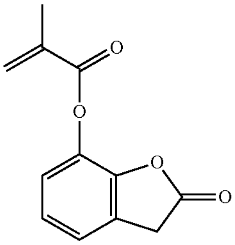
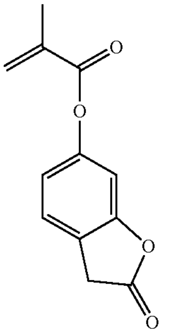
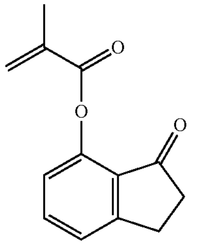
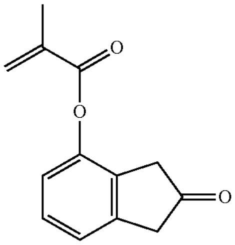
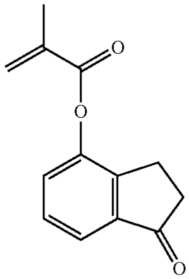
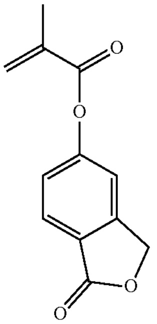
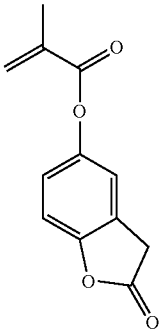
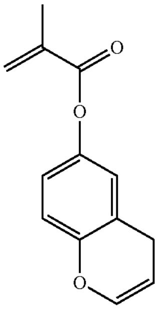
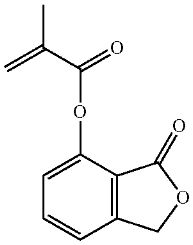

-continued
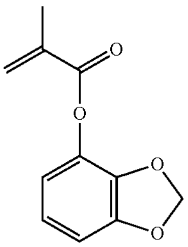
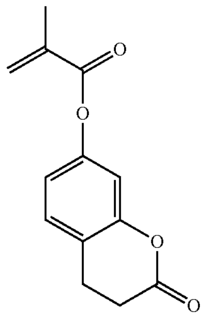
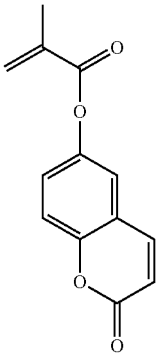
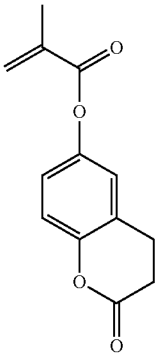
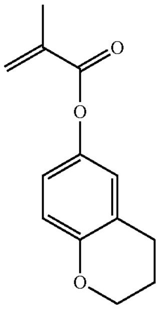
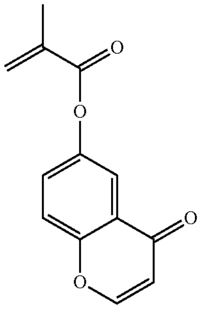
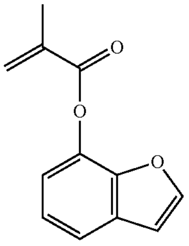
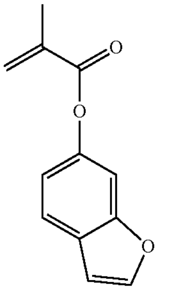
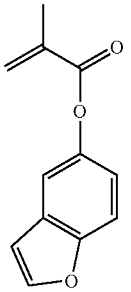
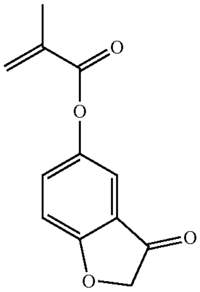
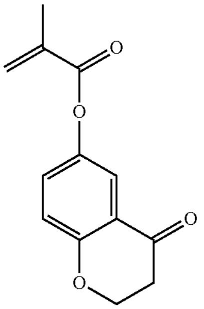
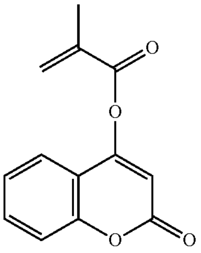
-continued
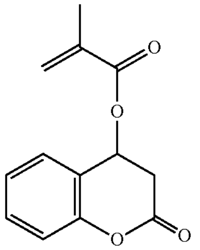
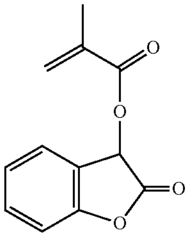
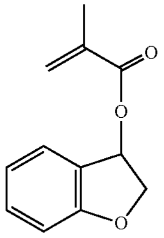
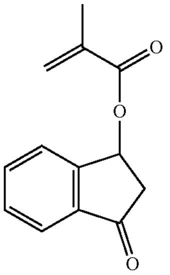
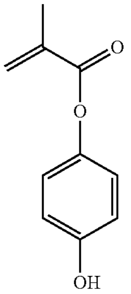
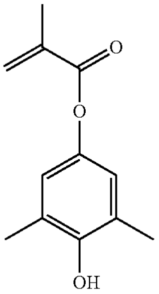
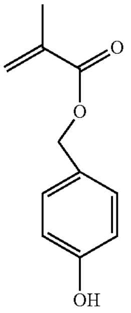
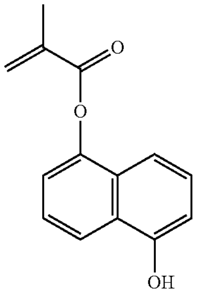
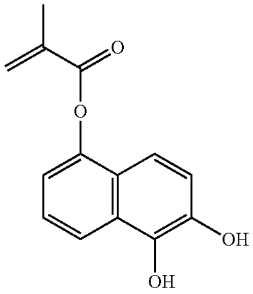
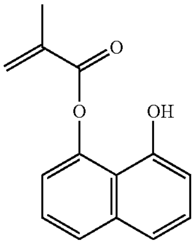
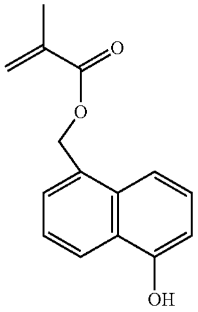
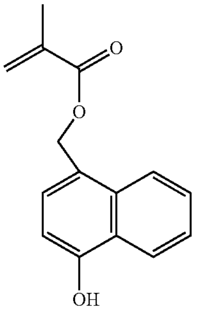
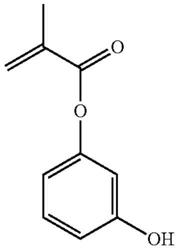
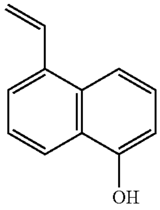

-continued
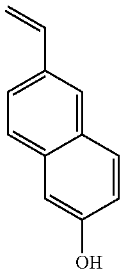
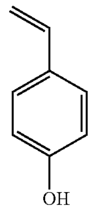
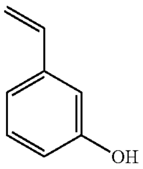
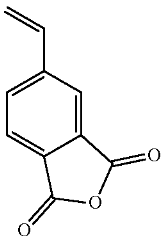
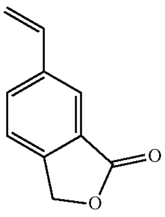
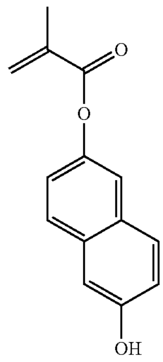
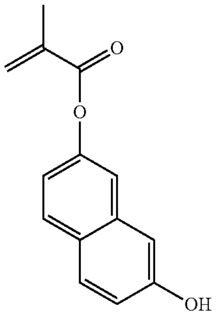
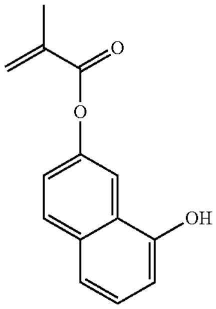
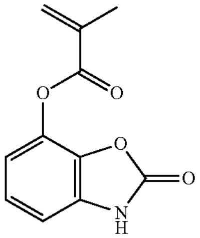
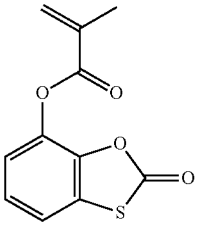
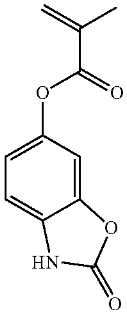
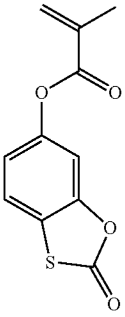
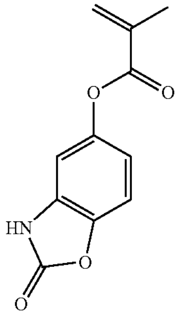
-continued
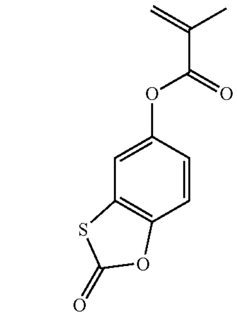
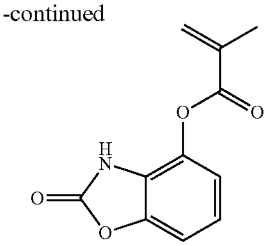
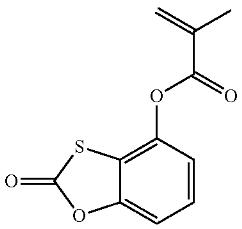
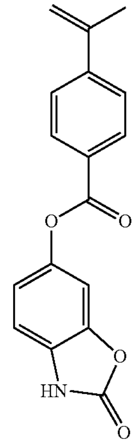
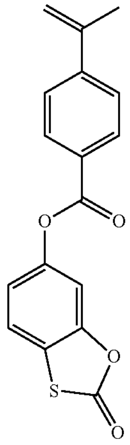
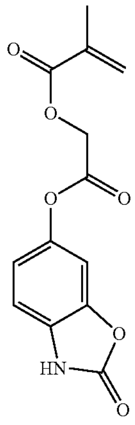
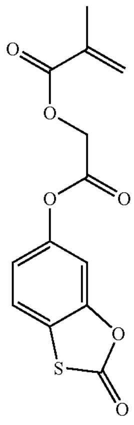
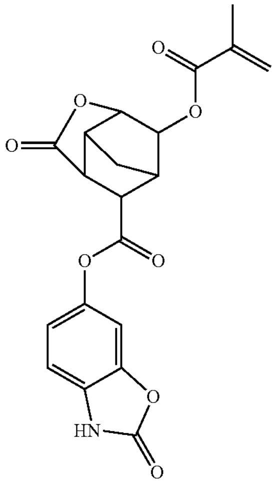
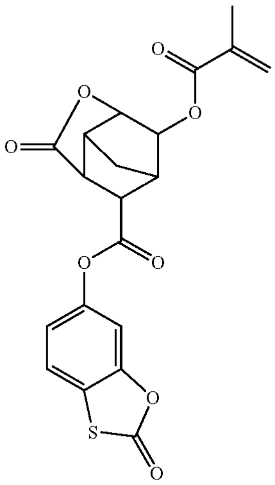

-continued

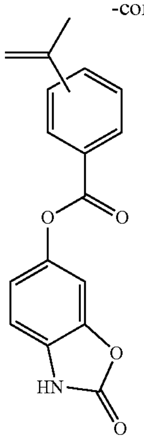

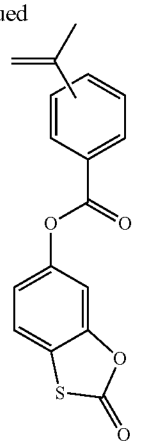

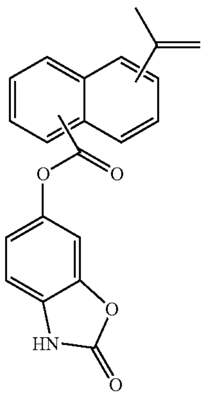

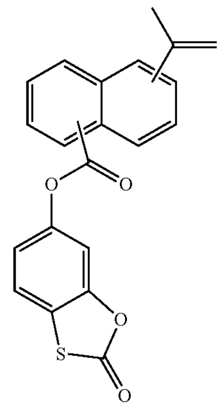

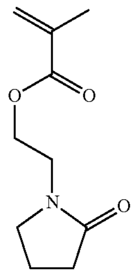

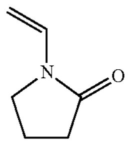

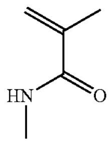

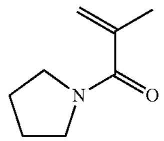

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

In a more preferred embodiment, polymer A may further comprise recurring units derived from sulfonium salts represented by the following formulae (d1) to (d3), which are also referred to as recurring units (d1) to (d3).

(d1)

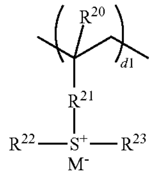

(d2)

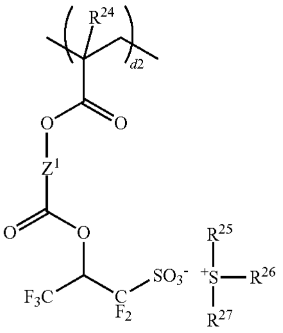

(d3)

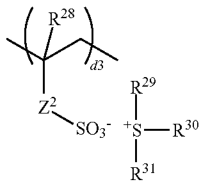

Herein $R^{20}$, $R^{24}$, and $R^{28}$ each are hydrogen or methyl. $R^{21}$ is a single bond, phenylene, —O—$R^A$—, or —C(═O)—$Y^0$—$R^A$— wherein $Y^0$ is —O— or —NH— and $R^A$ is a $C_1$-$C_6$ straight, branched or cyclic alkylene group or $C_2$-$C_6$ straight, branched or cyclic alkenylene group which may contain a carbonyl (—CO—), ester (—COO—), ether (—O—) or hydroxyl moiety, or phenylene group. $R^{22}$, $R^{23}$, $R^{25}$, $R^{26}$, $R^{27}$, $R^{29}$, $R^{30}$, and $R^{31}$ are each independently a $C_1$-$C_{12}$ straight, branched or cyclic alkyl group which may contain a carbonyl, ester, ether or hydroxyl moiety, a $C_6$-$C_{12}$ aryl group, $C_7$-$C_{20}$ aralkyl group, or mercaptophenyl group. $Z^1$ is a single bond or a $C_1$-$C_{12}$ straight, branched or cyclic alkylene group or $C_2$-$C_{12}$ straight, branched or cyclic alkenylene group which may contain an ether moiety, ester moiety or lactone ring, or $C_6$-$C_{10}$ arylene group. $Z^2$ is a single bond, methylene, ethylene, phenylene, fluorinated phenylene, —O—$R^{32}$—, or —C(═O)—$Z^3$—$R^{32}$— wherein $Z^3$ is —O— or —NH— and $R^{32}$ is a $C_1$-$C_{12}$ straight, branched or cyclic alkylene or $C_2$-$C_{12}$ alkenylene group which may contain a carbonyl, ester, ether or hydroxyl moiety, or phenylene group. $M^-$ is a non-nucleophilic counter ion, d1 to d3 are numbers in the range: $0 \leq d1 \leq 0.5$, $0 \leq d2 \leq 0.5$, $0 \leq d3 \leq 0.5$, and $0 < d1+d2+d3 \leq 0.5$.

Binding an acid generator to the polymer backbone is effective for reducing acid diffusion and preventing the resolution from lowering due to blur by acid diffusion. Additionally, edge roughness (LER, LWR) is improved because the acid generator is uniformly dispersed.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl) imide; methidates such as tris(trifluoromethylsulfonyl)methide and tris(perfluoroethylsulfonyl)methide.

Other non-nucleophilic counter ions $M^-$ include sulfonates having fluorine substituted at α-position as represented by the formula (K-1) and sulfonates having fluorine substituted at α- and β-positions as represented by the formula (K-2).

(K-1)

$$R^{41}—CF_2—SO_3^-$$

(K-2)

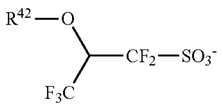

In formula (K-1), $R^{41}$ is hydrogen, or a $C_1$-$C_{20}$ straight, branched or cyclic alkyl group, $C_2$-$C_{20}$ alkenyl group, or $C_6$-$C_{20}$ aryl group, which may have an ether, ester, carbonyl moiety, lactone ring or fluorine. In formula (K-2), $R^{42}$ is hydrogen, or a $C_1$-$C_{30}$ straight, branched or cyclic alkyl group, $C_2$-$C_{30}$ straight, branched or cyclic acyl group, $C_2$-$C_{20}$ alkenyl group, $C_6$-$C_{20}$ aryl group or $C_6$-$C_{20}$ aryloxy group, which may have an ether, ester, carbonyl moiety or lactone ring.

Understandably, when a polymer having copolymerized therein recurring units of at least one type selected from units (d1) to (d3) is used as the base resin in a resist composition, the addition of a PAG to be described later may be omitted.

The polymer A may have further copolymerized therein recurring units of any type selected from units having the formulae (e1) to (e5), which are also referred to as recurring units (e1) to (e5).

(e1)

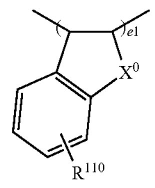

(e2)

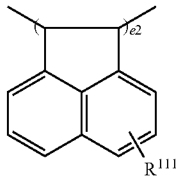

(e3)

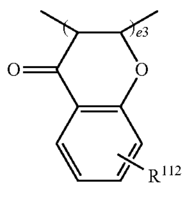

-continued (e4)

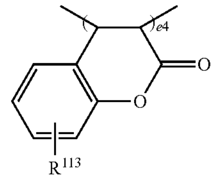

(e5)

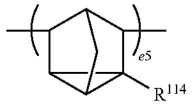

Herein $R^{110}$ to $R^{114}$ each are hydrogen, $C_1$-$C_{30}$ alkyl, partially or entirely halo-substituted $C_1$-$C_{30}$ alkyl, hydroxyl, $C_1$-$C_{30}$ alkoxy, $C_2$-$C_{30}$ acyl, $C_2$-$C_{30}$ alkoxycarbonyl, $C_6$-$C_{10}$ aryl, halogen, or 1,1,1,3,3,3-hexafluoro-2-propanol group; and $X^0$ is a methylene, ether or sulfide group.

Additional recurring units (f) may be incorporated in polymer A. Exemplary recurring units (f) are derived from styrene, vinylnaphthalene, vinylanthracene, vinylpyrene, methyleneindane, and the like.

The polymer A defined herein may be synthesized by any desired methods, for example, by dissolving suitable monomers selected from the monomers corresponding to recurring units (a) to (f) in an organic solvent, adding a radical polymerization initiator thereto, and effecting heat polymerization. Examples of the organic solvent which can be used for polymerization include toluene, benzene, tetrahydrofuran, diethyl ether, dioxane, cyclohexane, cyclopentane, methyl ethyl ketone, and γ-butyrolactone. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for conversion to hydroxystyrene or hydroxyvinylnaphthalene units. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In polymer A, recurring units (a) and (b) may be incorporated in the following molar fraction: $0<a<1.0$, $0<b<1.0$, and $0.1 \le a+b \le 1.0$. Where units (b) are units (b1) and/or (b2), the units are in the range: $0<a<1.0$, $0 \le b1<1.0$, $0 \le b2<1.0$, $0<b1+b2<1.0$, and $0.1 \le a+b1+b2 \le 1.0$. Where units (b) are units (b3), the units are in the range: $0<a<1.0$, $0<b3<1.0$, and $0.1 \le a+b3 \le 1.0$.

The fraction of recurring units (c) is in the range: $0 \le c \le 0.9$, where unit (c) is incorporated, preferably $0<c \le 0.9$ and $0.2 \le a+b+c \le 1.0$. Where units (b) are units (b1) and/or (b2), the units are preferably in the range: $0.02 \le a \le 0.8$, $0 \le b1 \le 0.8$, $0 \le b2 \le 0.8$, $0.1 \le b1+b2 \le 0.8$, and $0.1 \le c \le 0.88$; more preferably $0.05 \le a \le 0.75$, $0 \le b1 \le 0.7$, $0 \le b2 \le 0.7$, $0.1 \le b1+b2 \le 0.75$, and $0.15 \le c \le 0.85$; even more preferably $0.07 \le a \le 0.7$, $0 \le b1 \le 0.65$, $0 \le b2 \le 0.65$, $0.1 \le b1+b2 \le 0.7$, and $0.2 \le c \le 0.83$. The sum is preferably in the range: $0.2 \le a+b1+b2+c \le 1.0$, more preferably $0.3 \le a+b1+b2+c \le 1.0$, and even more preferably $0.4 \le a+$ $b1+b2+c \le 1.0$. Where units (b) are units (b3), the units are preferably in the range: $0.02 \le a \le 0.8$, $0.1 \le b3 \le 0.8$, and $0.1 \le c \le 0.88$; more preferably $0.05 \le a \le 0.75$, $0.1 \le b3 \le 0.75$, and $0.15 \le c \le 0.85$; even more preferably $0.07 \le a \le 0.7$, $0.1 \le b3 \le 0.7$, and $0.2 \le c \le 0.83$. The sum is preferably in the range: $0.2 \le a+b3+c \le 1.0$, more preferably $0.3 \le a+b3+c \le 1.0$, and even more preferably $0.4 \le a+b3+c \le 1.0$.

The fraction of recurring units (d1) to (d3) is in the range: $0 \le d1 \le 0.5$, $0 \le d2 \le 0.5$, $0 \le d3 \le 0.5$, and $0 \le d1+d2+d3 \le 0.5$, and where any of units (d1) to (d3) is incorporated, $0 \le d1+d2+d3 \le 0.5$; preferably $0 \le d1 \le 0.4$, $0 \le d2 \le 0.4$, $0 \le d3 \le 0.4$, and $0 < d1+d2+d3 \le 0.4$; more preferably $0 \le d1 \le 0.3$, $0 \le d2 \le 0.3$, $0 \le d3 \le 0.3$, and $0 < d1+d2+d3 \le 0.3$; and even more preferably $0 \le d1 \le 0.2$, $0 \le d2 \le 0.2$, $0 \le d3 \le 0.2$, and $0 \le d1+d2+d3 \le 0.25$. The sum is preferably in the range: $0.2 \le a+b1+b2+c+d1+d2+d3 \le 1.0$, more preferably $0.4 \le a+b1+b2+c+d1+d2+d3 \le 1.0$.

The fraction of recurring units (e1) to (e5) is in the range: $0 \le e1 \le 0.5$, $0 \le e2 \le 0.5$, $0 \le e3 \le 0.5$, $0 \le e4 \le 0.5$, $0 \le e5 \le 0.5$, and $0 \le e1+e2+e3+e4+e5 \le 0.5$, and where any of units (e1) to (e5) is incorporated, $0 < e1+e2+e3+e4+e5 \le 0.5$; preferably $0 \le e1 \le 0.4$, $0 \le e2 \le 0.4$, $0 \le e3 \le 0.4$, $0 \le e4 \le 0.4$, $0 \le e5 \le 0.4$, and $0 < e1+e2+e3+e4+e5 \le 0.4$; more preferably $0 \le e1 \le 0.3$, $0 \le e2 \le 0.3$, $0 \le e3 \le 0.3$, $0 \le e4 \le 0.3$, $0 \le e5 \le 0.3$, and $0 < e1+e2+e3+e4+e5 < 0.3$.

The fraction of recurring units (f) is in the range: $0 \le f \le 0.5$, preferably $0 \le f \le 0.4$, more preferably $0 \le f \le 0.3$. It is preferred that $a+b+c+d1+d2+d3+e1+e2+e3+e4+e5+f=1$.

The polymer A should have a weight average molecular weight (Mw) in the range of 1,000 to 500,000, and preferably 2,000 to 30,000, as measured versus polystyrene standards by GPC using tetrahydrofuran solvent. With Mw≥1,000, the resist composition is heat resistant. A polymer with Mw≤500,000 is fully alkali soluble and avoids a footing phenomenon after pattern formation.

If a multi-component copolymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, polymer A should preferably have a narrow dispersity (Mw/Mn) of 1.0 to 2.0, especially 1.0 to 1.5, in order to provide a resist composition suitable for micropatterning to a small feature size.

The polymer A is advantageously used as a base resin in a resist composition. In this context, not only a single polymer A may be used as the base resin, but also a blend of two or more polymers A which differ in compositional ratio, molecular weight or dispersity or a blend of polymer A and a polymer B free of recurring units (a) is acceptable.

Acid Generator

An acid generator may be added to a resist composition so that it may function as a chemically amplified resist composition. Typical of the acid generator used herein is a photoacid generator (PAG) capable of generating an acid in response to actinic light or radiation.

The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. Exemplary PAGs are described in U.S. Pat. No. 7,537,880 (JP-A 2008-111103, paragraphs [0122] to [0142]).

As the PAG, compounds having the formula (1) are also preferably used.

(1)

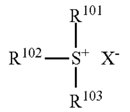

In formula (1), $R^{101}$, $R^{102}$ and $R^{103}$ are each independently a $C_1$-$C_{20}$ straight, branched or cyclic monovalent hydrocarbon group which may contain a heteroatom, any two or more of $R^{101}$, $R^{102}$ and $R^{103}$ may bond together to form a ring with the sulfur atom to which they are attached.

In formula (1), $X^-$ is an anion selected from the formulae (1A) to (1D).

(1A)

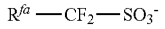

(1B)

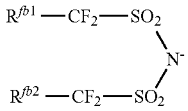

(1C)

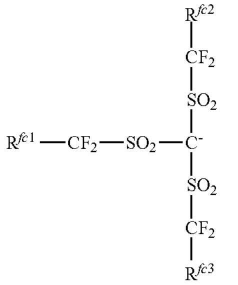

(1D)

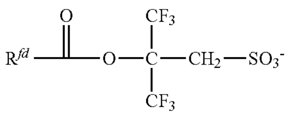

In formula (1A), $R^{fa}$ is fluorine or a $C_1$-$C_{40}$ straight, branched or cyclic monovalent hydrocarbon group which may contain a heteroatom.

Of the anions of formula (1A), a structure having formula (1A') is preferred.

(1A')

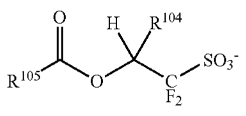

In formula (1A'), $R^{104}$ is hydrogen or trifluoromethyl, preferably trifluoromethyl. $R^{105}$ is a $C_1$-$C_{38}$ straight, branched or cyclic monovalent hydrocarbon group which may contain a heteroatom. Suitable heteroatoms include oxygen, nitrogen, sulfur and halogen, with oxygen being preferred. Of the monovalent hydrocarbon groups, those of 6 to 30 carbon atoms are preferred because a high resolution is available in fine pattern formation. Suitable monovalent hydrocarbon groups include methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, icosanyl, allyl, benzyl, diphenylmethyl, tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. Also included are the foregoing groups in which at least one hydrogen is replaced by a radical containing a heteroatom such as oxygen, sulfur, nitrogen or halogen, or in which a radical containing a heteroatom such as oxygen, sulfur or nitrogen intervenes between carbon atoms, so that the group may contain a hydroxyl, cyano, carbonyl, ether, ester, sulfonic acid ester, carbonate, lactone ring, sultone ring, carboxylic acid anhydride or haloalkyl radical.

With respect to the synthesis of the sulfonium salt having an anion of formula (1A'), reference is made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the sulfonium salt having an anion of formula (1A) are shown below, but not limited thereto.

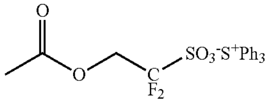

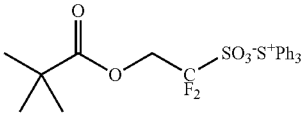

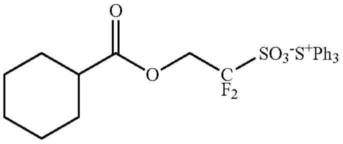

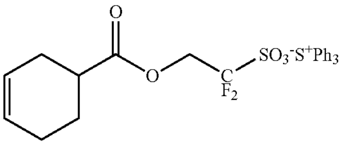

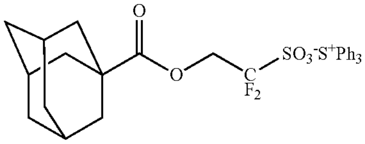

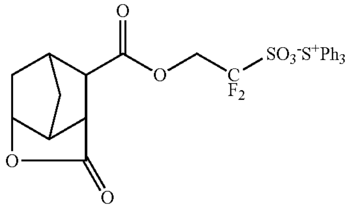

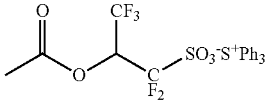

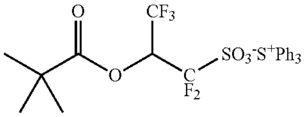

-continued

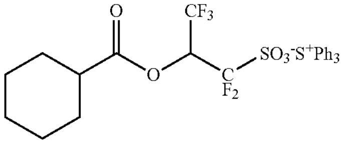

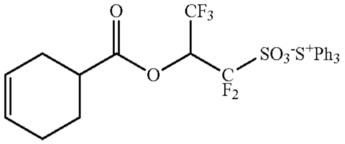

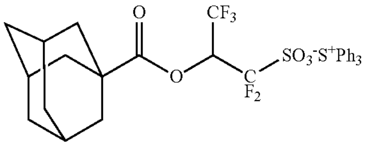

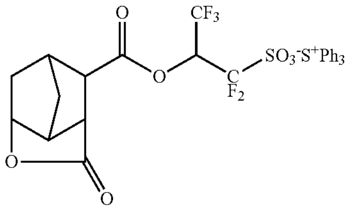

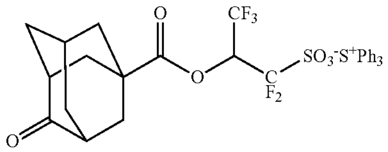

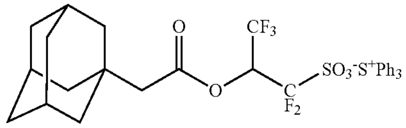

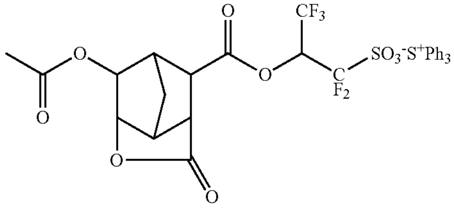

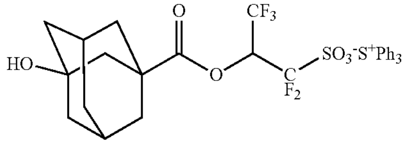

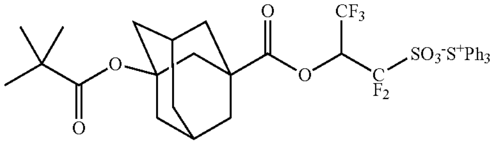

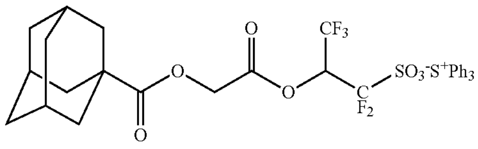

-continued
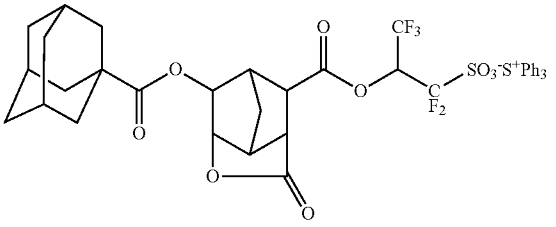
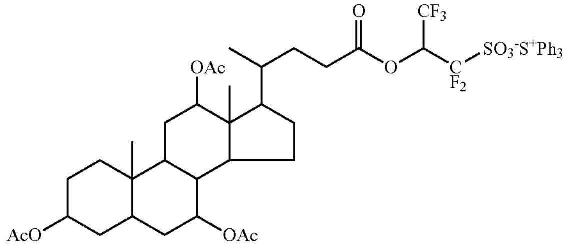
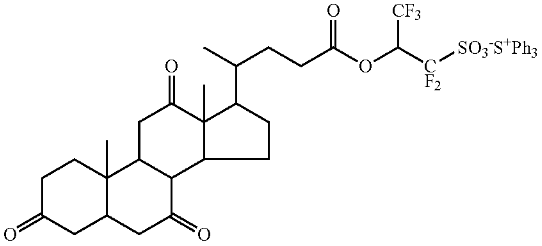
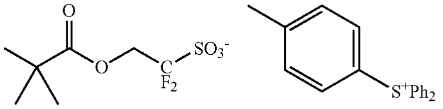
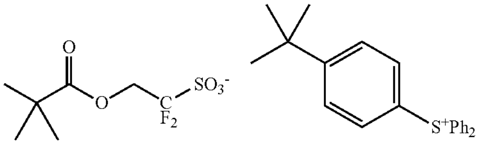
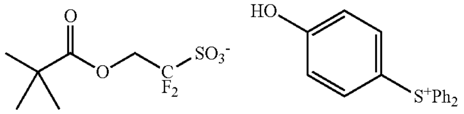
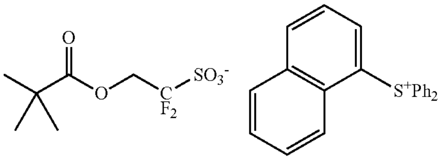
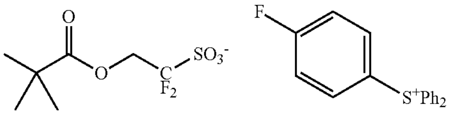
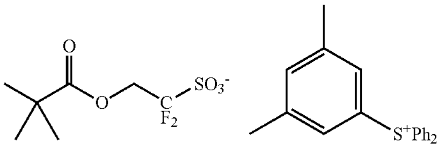
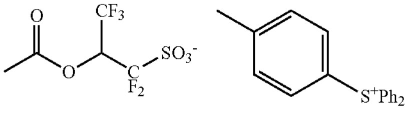
-continued
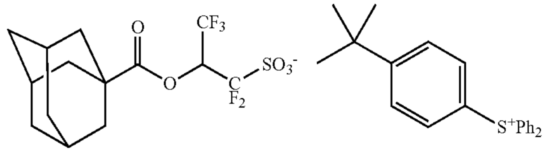
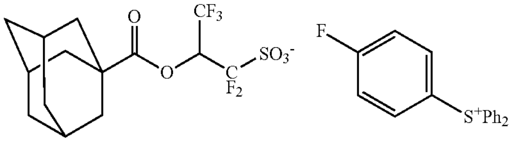
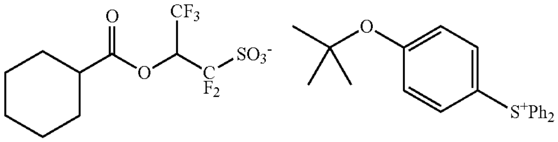
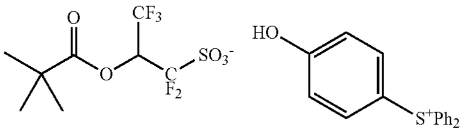
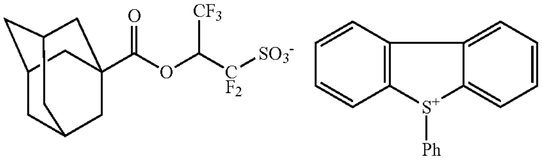
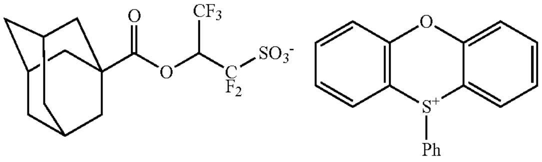
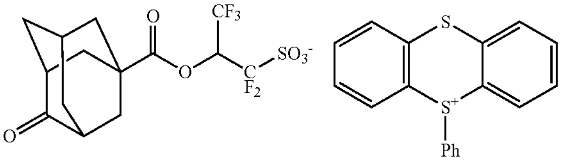
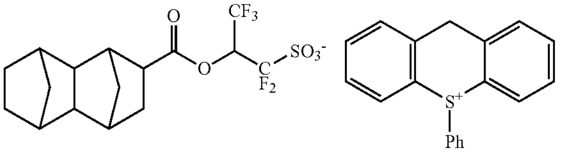
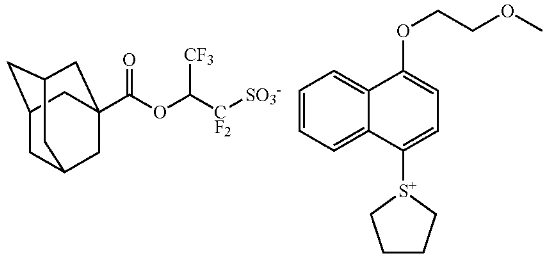
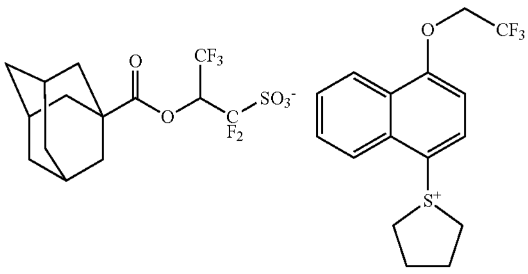

-continued

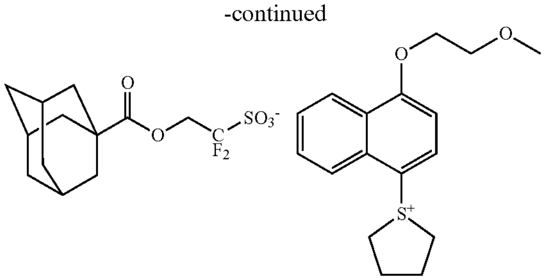

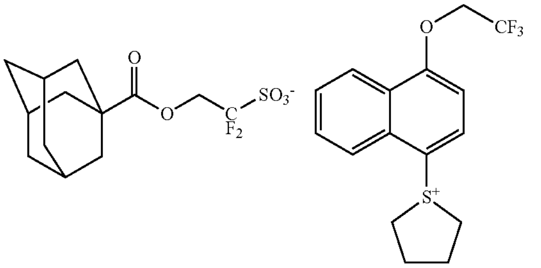

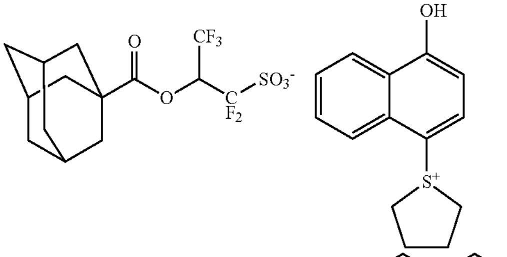

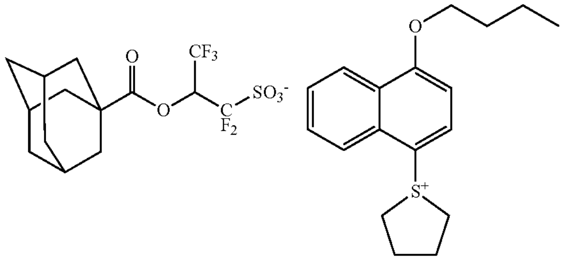

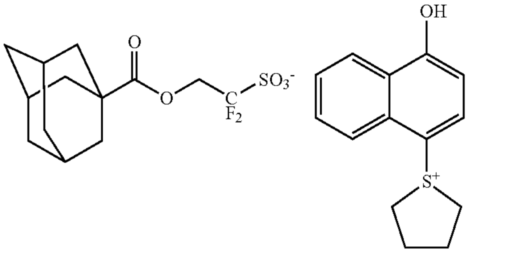

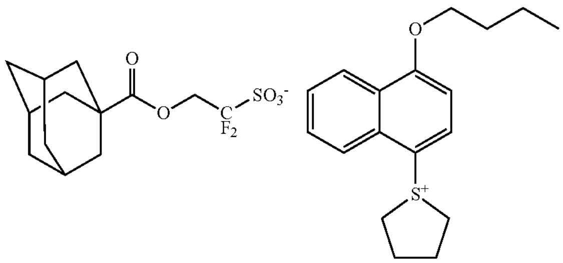

In formula (1B), $R^{fb1}$ and $R^{fb2}$ are each independently fluorine or a $C_1$-$C_{40}$ straight, branched or cyclic monovalent hydrocarbon group which may contain a heteroatom. Suitable monovalent hydrocarbon groups are as exemplified above for $R^{105}$. Preferably $R^{fb1}$ and $R^{fb2}$ each are fluorine or a $C_1$-$C_4$ straight fluorinated alkyl group. A pair of $R^{fb1}$ and $R^{fb2}$ may bond together to form a ring with the linkage ($—CF_2—SO_2—N^-—SO_2—CF_2—$) to which they are attached, and preferably the pair is a fluorinated ethylene or fluorinated propylene group.

In formula (1C), $R^{fc1}$, $R^{fc2}$ and $R^{fc3}$ are each independently fluorine or a $C_1$-$C_{40}$ straight, branched or cyclic monovalent hydrocarbon group which may contain a heteroatom. Suitable monovalent hydrocarbon groups are as exemplified above for $R^{105}$. Preferably $R^{fc1}$, $R^{fc2}$ and $R^{fc3}$ each are fluorine or a $C_1$-$C_4$ straight fluorinated alkyl group. A pair of $R^{fc1}$ and $R^{fc2}$ may bond together to form a ring with the linkage ($—CF_2—SO_2—C^-—SO_2—CF_2—$) to which they are attached, and preferably the pair is a fluorinated ethylene or fluorinated propylene group.

In formula (1D), $R^{fd}$ is a $C_1$-$C_{40}$ straight, branched or cyclic monovalent hydrocarbon group which may contain a heteroatom. Suitable monovalent hydrocarbon groups are as exemplified above for $R^{105}$.

With respect to the synthesis of the sulfonium salt having an anion of formula (1D), reference is made to JP-A 2010-215608 and JP-A 2014-133723.

Examples of the sulfonium salt having an anion of formula (1D) are shown below, but not limited thereto.

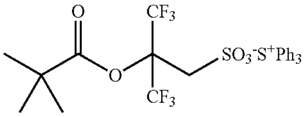

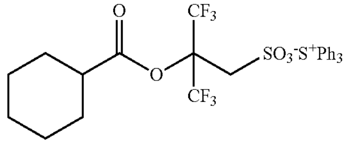

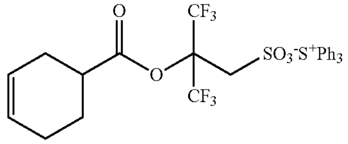

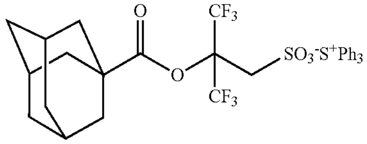

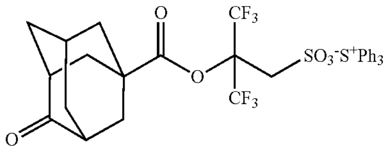

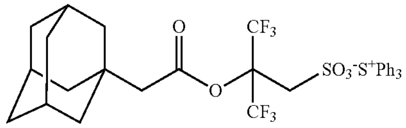

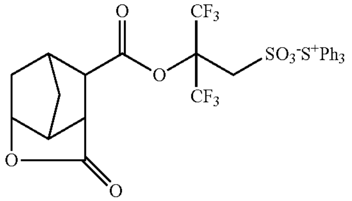

-continued

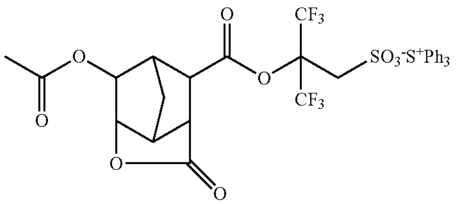

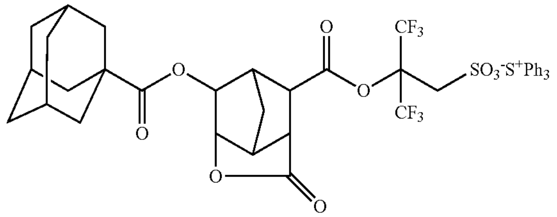

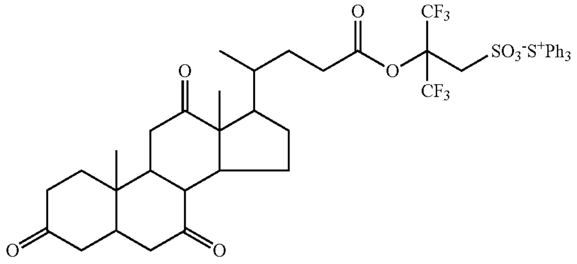

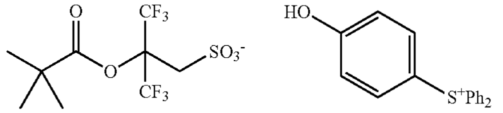

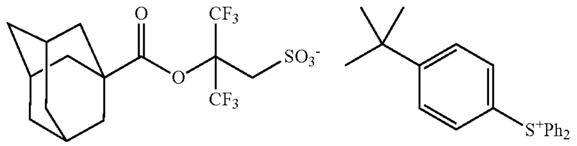

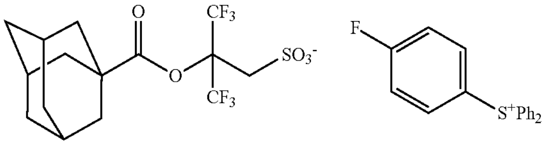

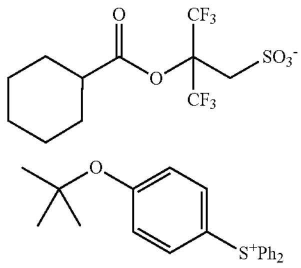

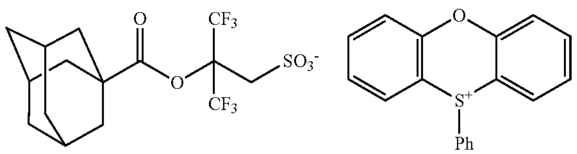

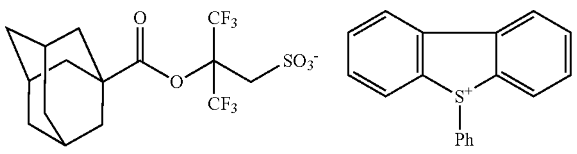

-continued

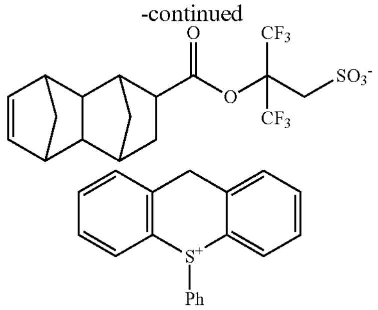

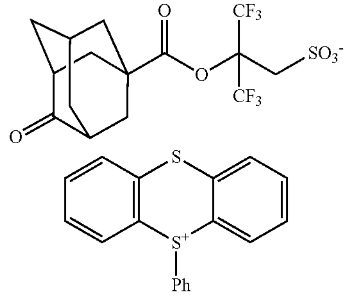

The compound having the anion of formula (1D) has a sufficient acid strength to cleave acid labile groups in the resist polymer because it is free of fluorine at α-position of sulfo group, but has two trifluoromethyl groups at β-position. Thus the compound is a useful PAG.

Also PAGs having the formula (2) are preferred.

(2)

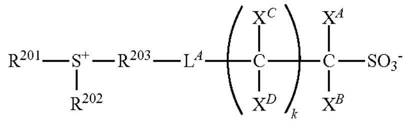

Herein, $R^{201}$ and $R^{202}$ are each independently a $C_1$-$C_{30}$ straight, branched or cyclic monovalent hydrocarbon group which may contain a heteroatom. $R^{203}$ is a $C_1$-$C_{30}$ straight, branched or cyclic divalent hydrocarbon group which may contain a heteroatom. Any two or more of $R^{201}$, $R^{202}$ and $R^{203}$ may bond together to form a ring with the sulfur atom to which they are attached. $L^A$ is a single bond or a $C_1$-$C_{20}$ straight, branched or cyclic divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

Suitable monovalent hydrocarbon groups include methyl, ethyl, propyl, isopropyl, n-butyl, s-butyl, t-butyl, n-pentyl, t-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbornyl, tricyclo[5.2.1.$0^{2,6}$]decanyl, adamantyl, phenyl, naphthyl and anthracenyl. Also included are the foregoing groups in which at least one hydrogen is replaced by a heteroatom such as oxygen, sulfur, nitrogen or halogen, or in which at least one carbon is replaced by a heteroatom such as oxygen, sulfur or nitrogen, so that the group may contain a hydroxyl, cyano, carbonyl, ether bond, ester bond, sulfonic acid ester bond, carbonate bond, lactone ring, sultone ring, carboxylic acid anhydride or haloalkyl radical.

Suitable divalent hydrocarbon groups include linear alkane diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, heptadecane-1,17-diyl; saturated cyclic divalent hydrocarbon groups such as cyclopentanediyl, cyclohexanediyl, norbornanediyl, and adamantanediyl; and unsaturated cyclic divalent hydrocarbon groups such as phenylene and naphthylene. Also included are the foregoing groups in which at least one hydrogen atom is replaced by an alkyl group such as methyl, ethyl, propyl, n-butyl or t-butyl, or in which at least one hydrogen atom is replaced by a radical containing a heteroatom such as oxygen, sulfur, nitrogen or halogen, or in which a radical containing a heteroatom such as oxygen, sulfur or nitrogen intervenes between carbon atoms, so that the group may contain a hydroxyl, cyano, carbonyl, ether, ester, sulfonic acid ester, carbonate, lactone ring, sultone ring, carboxylic acid anhydride or haloalkyl radical. Suitable heteroatoms include oxygen, nitrogen, sulfur and halogen, with oxygen being preferred.

Of the PAGs having formula (2), those having formula (2') are more preferred.

(2')

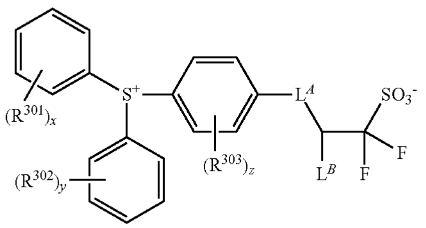

In formula (2'), $L^A$ is as defined above. $L^B$ is hydrogen or trifluoromethyl, preferably trifluoromethyl. $R^{301}$, $R^{302}$ and $R^{303}$ are each independently hydrogen or a $C_1$-$C_{20}$ straight, branched or cyclic monovalent hydrocarbon group which may contain a heteroatom. Suitable monovalent hydrocarbon groups are as exemplified above for $R^{105}$. The subscripts x and y each are an integer of 0 to 5, and z is an integer of 0 to 4.

Examples of the PAG having formula (2) are shown below, but not limited thereto. Herein $L^B$ is as defined above.

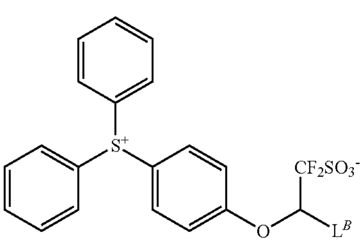

-continued

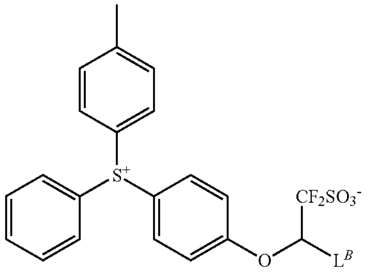

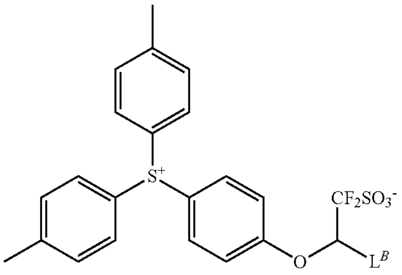

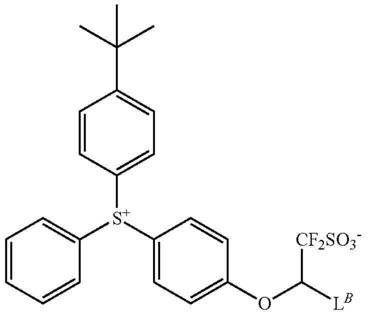

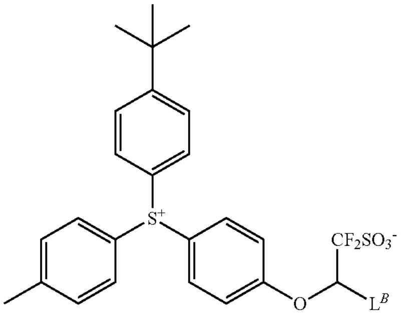

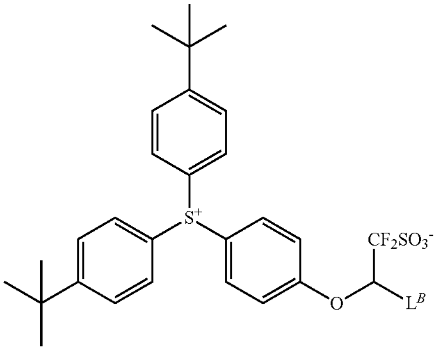

-continued
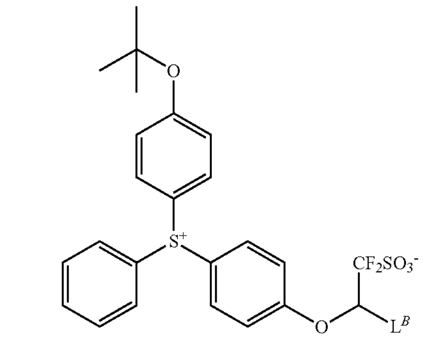
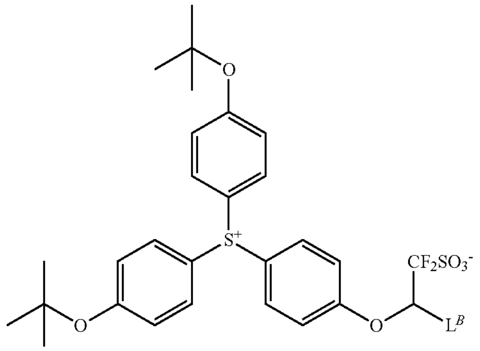
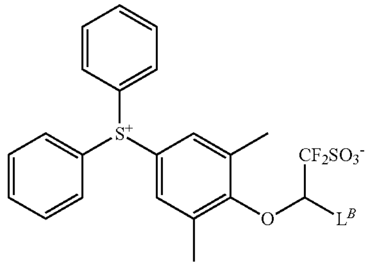
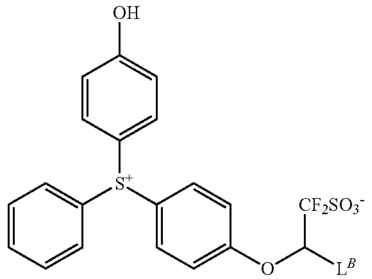
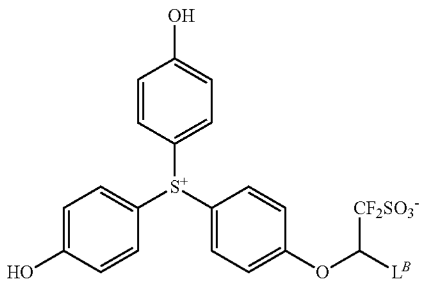
-continued
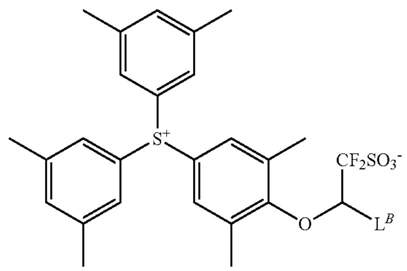
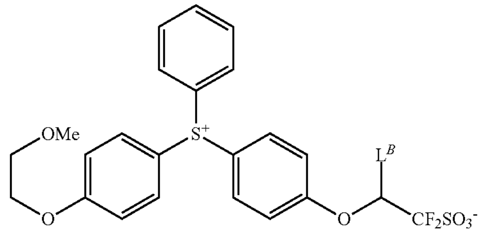
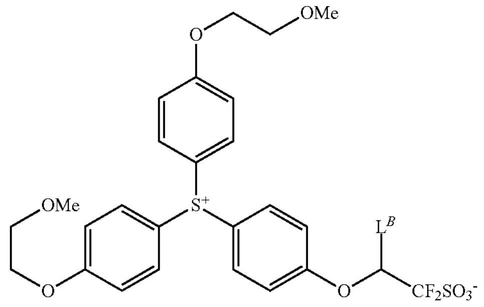
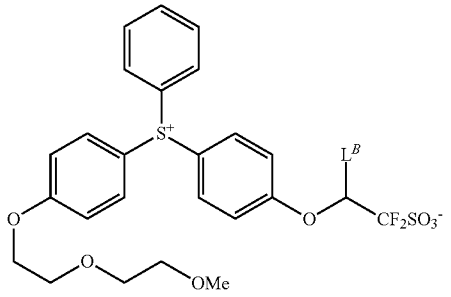
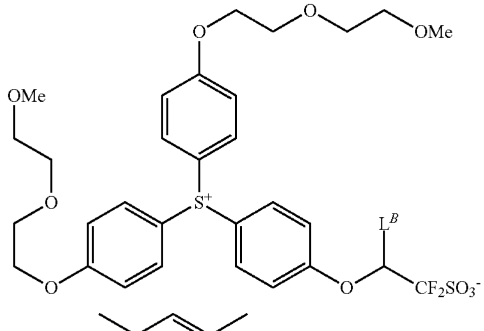
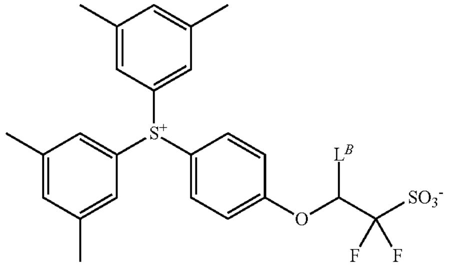

-continued
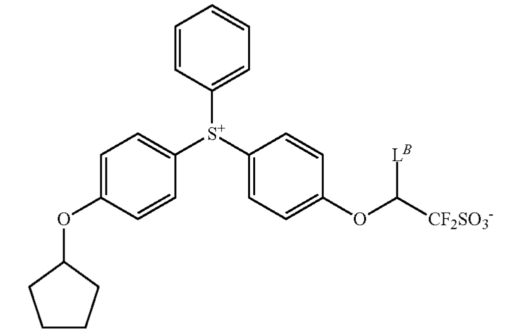
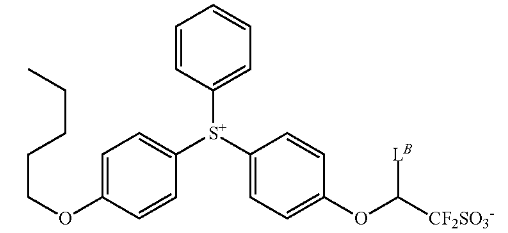
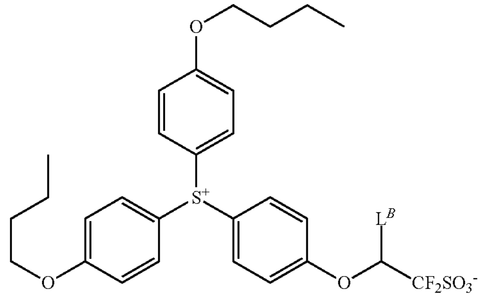
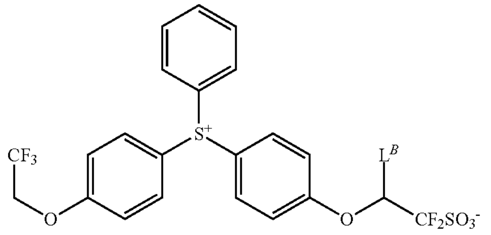
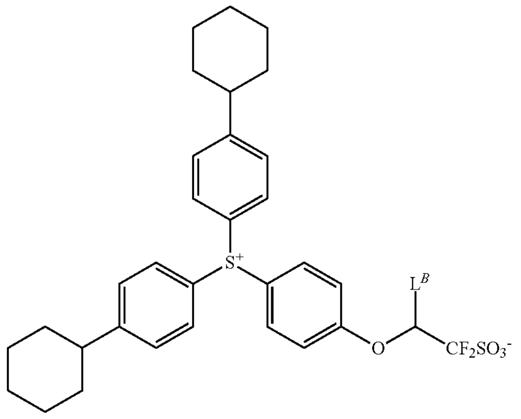
-continued
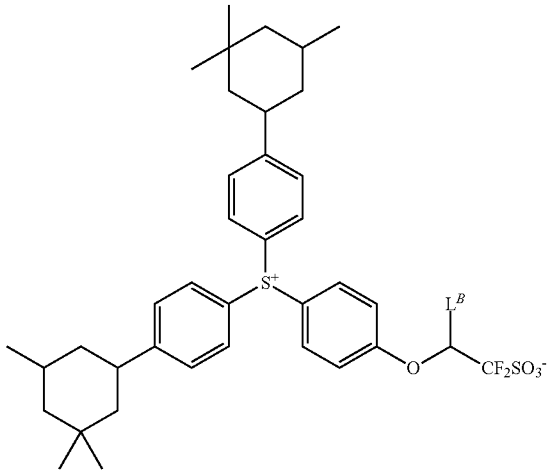
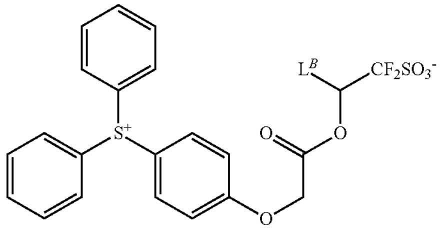
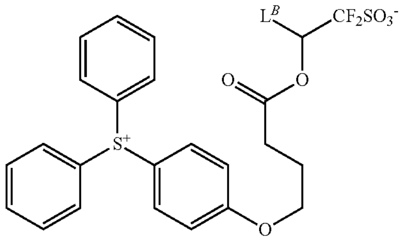
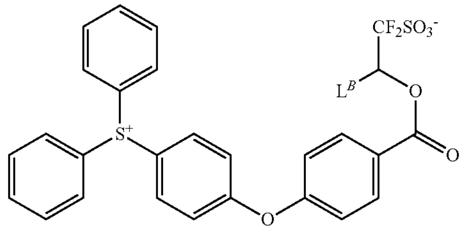
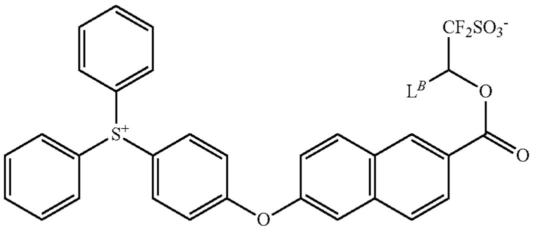
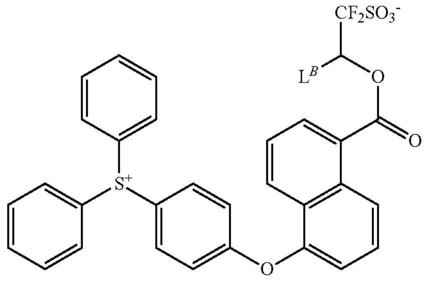

-continued

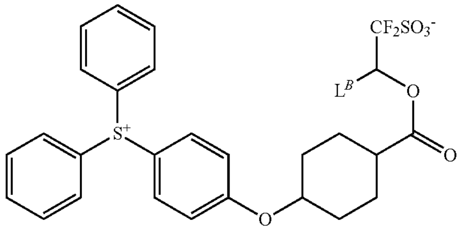

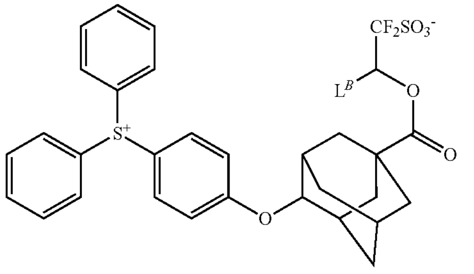

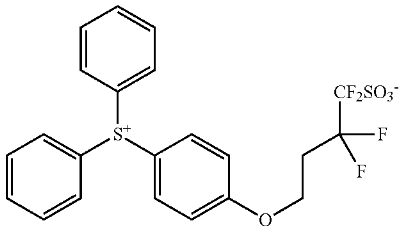

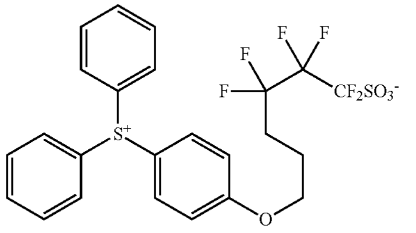

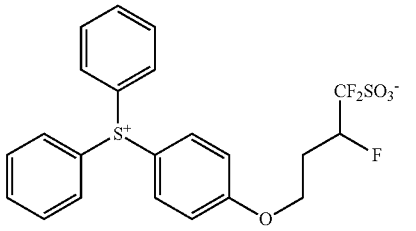

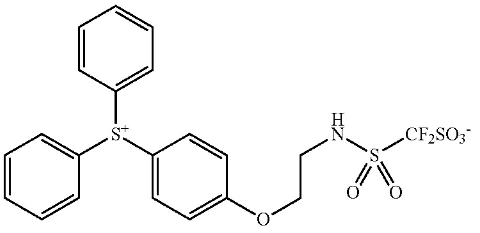

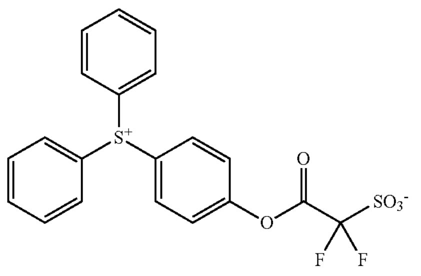

-continued

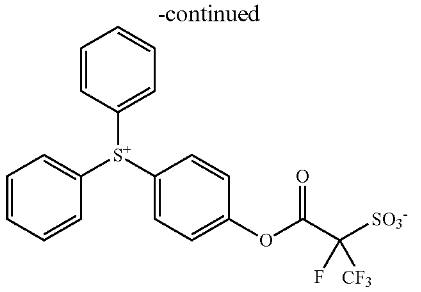

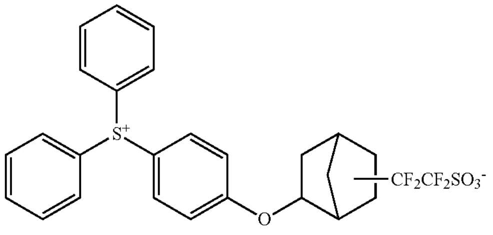

Of the foregoing PAGs, those compounds having an anion of formula (1A') or (1D) are especially preferred because of reduced acid diffusion and high solubility in resist solvent, and those compounds having an anion of formula (2') are especially preferred because of minimized acid diffusion.

An appropriate amount of the PAG added is 0.01 to 100 parts, more preferably 0.1 to 80 parts by weight per 100 parts by weight of the base resin. The PAGs may be used alone or in admixture.

Organic Solvent

The resist composition may comprise an organic solvent. Examples of the organic solvent are described in U.S. Pat. No. 7,537,880 (JP-A 2008-111103, paragraphs [0144]-[0145]). Specifically, exemplary solvents include ketones such as cyclohexanone and methyl n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, and mixtures thereof.

An appropriate amount of the organic solvent used is 50 to 10,000 parts, more preferably 100 to 5,000 parts by weight per 100 parts by weight of the base resin.

Other Components

The resist composition may further comprise any additives such as a basic compound, dissolution regulator, surfactant, and acetylene alcohol.

The addition of the basic compound to the resist composition is effective, for example, for reducing the rate of acid diffusion in the resist film, thus contributing to a further improvement in resolution. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146]-[0164] (U.S. Pat. No. 7,537,880). An appropriate amount of the basic compound added is 0 to 100 parts, more preferably 0.001 to 50 parts by weight per 100 parts by weight of the base resin.

The addition of the surfactant to the resist composition is effective for facilitating or controlling coating operation. Exemplary surfactants are described in JP-A 2008-111103, paragraphs [0165]-[0166]. An appropriate amount of the surfactant added is 0 to 10 parts, more preferably 0.0001 to 5 parts by weight per 100 parts by weight of the base resin.

The addition of the dissolution regulator to the resist composition is effective for exaggerating a difference in dissolution rate between exposed and unexposed regions, thus contributing to a further improvement in resolution. Exemplary dissolution regulators are described in US 2008090172 (JP-A 2008-122932, paragraphs [0155]-[0178]). An appropriate amount of the dissolution regulator added is 0 to 50 parts, more preferably 0 to 40 parts by weight per 100 parts by weight of the base resin.

Exemplary acetylene alcohols are described in JP-A 2008-122932, paragraphs [0179]-[0182]. An appropriate amount of the acetylene alcohol added is 0 to 2%, more preferably 0.02 to 1% by weight of the resist composition.

Also useful are quenchers of polymer type as described in JP-A 2008-239918. The polymeric quencher segregates at the resist surface after coating and thus enhances the rectangularity of resist pattern. When a protective film is applied on the resist film, the polymeric quencher is also effective for preventing any film thickness loss of resist pattern or rounding of pattern top. When the polymeric quencher is added, its amount is arbitrary as long as the benefits of the invention are not impaired.

Also an onium salt of sulfonic acid which is not fluorinated at α-position as represented by the formula (3) or carboxylic acid as represented by the formula (4) is useful as the quencher.

(3)

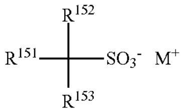

(4)

$$R^{154}—CO_2^{-}\ M^{+}$$

Herein $R^{151}$, $R^{152}$ and $R^{153}$ are each independently hydrogen, halogen exclusive of fluorine, or a $C_1$-$C_{40}$ straight, branched or cyclic monovalent hydrocarbon group which may contain a heteroatom, any two or more of $R^{151}$, $R^{152}$ and $R^{153}$ may bond together to form a ring with the carbon atom to which they are attached. $R^{154}$ is a $C_1$-$C_{40}$ straight, branched or cyclic monovalent hydrocarbon group which may contain a heteroatom. $M^+$ is an onium cation.

The onium salt of sulfonic acid which is not fluorinated at α-position is described in U.S. Pat. No. 8,795,942 (JP-A 2008-158339). The PAGs capable of generating sulfonic acid which is not fluorinated at α-position are exemplified in JP-A 2010-155824, paragraphs [0019]-[0036] and JP-A 2010-215608, paragraphs [0047]-[0082]. The onium salts of carboxylic acid are described in JP 3991462.

The anion in formula (3) or (4) is a conjugated base of weak acid. As used herein, the weak acid indicates an acidity insufficient to deprotect an acid labile group from an acid labile group-containing unit in the base resin. The onium salt having formula (3) or (4) functions as a quencher when used in combination with an onium salt type PAG having a conjugated base of a strong acid, typically a sulfonic acid which is fluorinated at α-position as the counter anion.

In a system using a mixture of an onium salt capable of generating a strong acid (e.g., α-position fluorinated sulfonic acid) and an onium salt capable of generating a weak acid (e.g., α-position non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

In particular, since sulfonium salts and iodonium salts of an α-position non-fluorinated sulfonic acid and a carboxylic acid are photo-decomposable, those portions receiving a high light intensity are reduced in quenching capability and increased in the concentration of an α-position fluorinated sulfonic acid, imide acid, or methide acid. This enables to form a pattern having an improved contrast in exposed area, further improved depth of focus (DOF) and satisfactory dimensional control.

If a PAG capable of generating a strong acid is an onium salt, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

In case the acid labile group is an acetal group which is very sensitive to acid, the acid for eliminating the protective group need not necessarily be an α-fluorinated sulfonic acid, imide acid or methide acid. Sometimes, deprotection reaction may take place even with α-position non-fluorinated sulfonic acid. In this case, since an onium salt of sulfonic acid cannot be used as the quencher, an onium salt of carboxylic acid is preferably used alone as the quencher.

Of the onium salts of α-position non-fluorinated sulfonic acid and carboxylic acid, sulfonium salts of sulfonic acid having the following formula (3') and sulfonium salts of carboxylic acid having the following formula (4') are preferred.

(3')

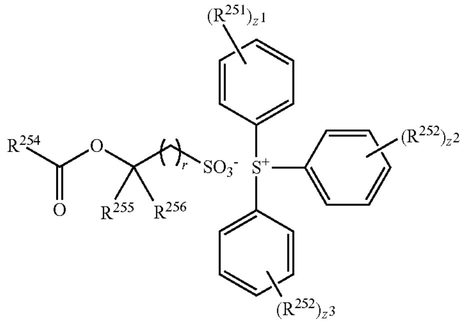

-continued (4′)

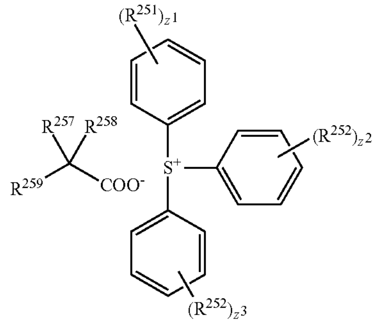

Herein $R^{251}$, $R^{252}$ and $R^{253}$ are each independently a $C_1$-$C_{20}$ straight, branched or cyclic monovalent hydrocarbon group which may contain a heteroatom, any two or more of $R^{251}$, $R^{252}$ and $R^{253}$ may bond together to form a ring with the atom to which they are attached and intervening atoms. $R^{254}$ is a $C_1$-$C_{40}$ straight, branched or cyclic monovalent hydrocarbon group which may contain a heteroatom. $R^{255}$ and $R^{256}$ are each independently hydrogen or trifluoromethyl. $R^{257}$ and $R^{258}$ are each independently hydrogen, fluorine or trifluoromethyl. $R^{259}$ is hydrogen, hydroxyl, a $C_1$-$C_{35}$ straight, branched or cyclic monovalent hydrocarbon group which may contain a heteroatom, or optionally substituted $C_6$-$C_{30}$ aryl group. The subscript r is an integer of 1 to 3, $z^1$, $z^2$ and $z^3$ are each independently an integer of 0 to 5.

The quencher or onium salt may be used alone or in admixture of two or more. An appropriate amount of the quencher is 0 to 50 parts, preferably 0.001 to 50 parts, more preferably 0.01 to 20 parts by weight, per 100 parts by weight of the base resin. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate.

Also a polymeric additive may be added for improving the water repellency on surface of a resist film as spin coated. The water repellency improver may be used in the topcoatless immersion lithography. The preferred water repellency improvers include polymers having a fluorinated alkyl group and polymers of specific structure with a 1,1,1,3,3,3-hexafluoro-2-propanol residue. Their examples are described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellency improver and is effective for preventing evaporation of acid during PEB and any hole pattern opening failure after development. An appropriate amount of the water repellency improver is 0.1 to 20 parts, preferably 0.5 to 10 parts by weight per 100 parts by weight of the base resin.

As alluded to previously, polymer A is advantageously used as a base resin in a resist composition. Specifically, polymer A is used as a base resin and combined with any desired components including an organic solvent, acid generator, dissolution regulator, basic compound, and surfactant to formulate a resist composition. This resist composition has a very high sensitivity in that the dissolution rate in developer of polymer A in exposed areas is accelerated by catalytic reaction. In addition, the resist film has a high dissolution contrast, resolution, exposure latitude, and process adaptability, and provides a good pattern profile after exposure, yet better etch resistance, and minimal proximity bias because of restrained acid diffusion. By virtue of these advantages, the composition is fully useful in commercial application and suited as a pattern-forming material for the fabrication of VLSIs. Particularly when an acid generator is included to formulate a chemically amplified resist composition capable of utilizing acid catalyzed reaction, the composition has a higher sensitivity and is further improved in the properties described above.

Process

The resist composition, typically chemically amplified resist composition comprising a base resin containing polymer A, an acid generator, an organic solvent, and a basic compound is used in the fabrication of various integrated circuits. Pattern formation using the resist composition may be performed by well-known lithography processes. The process generally involves coating, prebake, exposure, and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, or MoSi) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

If desired, a protective film may be formed on the resist film. The protective film is preferably formed of an alkaline developer-soluble composition so that both formation of a resist pattern and stripping of the protective film may be achieved during development. The protective film has the functions of restraining outgassing from the resist film, filtering or cutting off out-of-band (OOB) light having a wavelength of 140 to 300 nm emitted by the EUV laser (other than 13.5 nm), and preventing the resist film from assuming T-top profile or from losing its thickness under environmental impacts.

The resist film is then exposed to a desired pattern of high-energy radiation such as UV, deep-UV, EUV, EB, x-ray, soft x-ray, excimer laser light, γ-ray or synchrotron radiation directly or through a mask. The exposure dose is preferably about 1 to 200 $mJ/cm^2$, more preferably about 10 to 100 $mJ/cm^2$, or 0.1 to 100 $\mu C/cm^2$, more preferably 0.5 to 50 $\mu C/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 5 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). Where polymer A contains recurring units (b1) and/or (b2), the resist film in the exposed area is dissolved in the developer whereas the resist film in the unexposed area is not dissolved. In this way, the desired positive pattern is formed on the substrate. Where polymer A contains recurring units (b3), a negative pattern is formed on the substrate. It is appreciated that the resist composition of the invention is best suited for micro-patterning using such high-energy radiation as EB, EUV, x-ray, soft x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as t-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

Where polymer A contains recurring units (b1) and/or (b2), a negative pattern may be formed from the resist composition by organic solvent development. Examples of the developer include 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, which may be used alone or in admixture.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene, and mesitylene. The solvents may be used alone or in admixture.

EXAMPLE

Examples and Comparative Examples are given below for further illustrating the invention, but they should not be construed as limiting the invention thereto. All parts (pbw) are by weight. Mw is a weight average molecular weight as measured versus polystyrene standards by GPC using tetrahydrofuran (THF) solvent.

1. Synthesis of Monomers

Synthesis Example 1

Synthesis of Monomer 1

Under ice cooling, 92.4 g of methacrylic acid chloride was added dropwise to a solution of 45 g of 2-hydroxy-N-methylsuccinimide and 3.7 g of 4-(dimethylamino)pyridine in 500 g of THF. Stirring was continued at room temperature for 5 hours. Water was added to the solution to quench the reaction. The reaction product was treated by ordinary aqueous workup and purified by silica gel column chromatography, yielding 120 g of Monomer 1.

Monomer 1

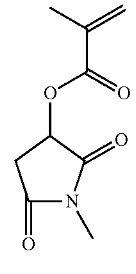

Synthesis Example 2

Synthesis of Monomer 2

The same procedure as in Synthesis Example 1 was repeated aside from using 128 g of 2-carboxymethyl methacrylate instead of methacrylic acid chloride, yielding 128 g of Monomer 2.

Monomer 2

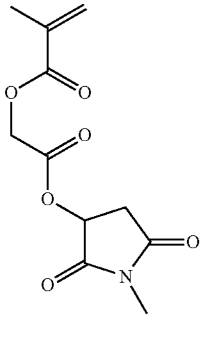

2. Synthesis of Polymers

Monomers 3 and 4 and PAG Monomers 1 and 2 used in Synthesis Examples are shown below by their structure.

Monomer 3

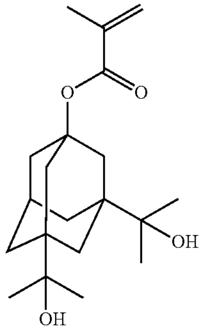

Monomer 4

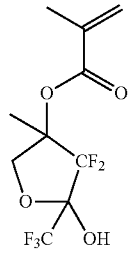

PAG Monomer 1

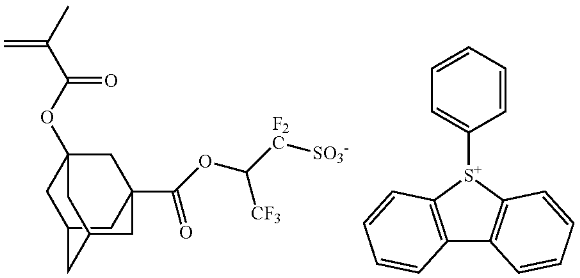

-continued

PAG Monomer 2

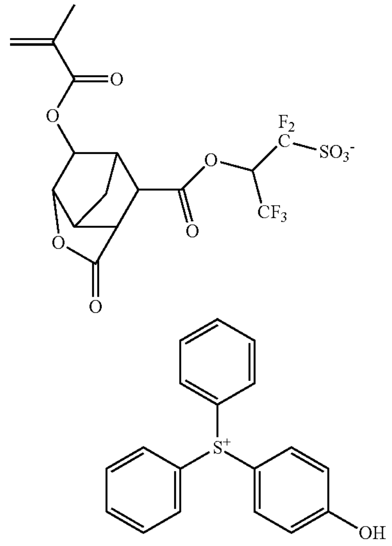

Synthesis Example 3

Synthesis of Polymer 1

A 2-L flask was charged with 5.6 g of 1-isopropyl-exo-tetracyclo[4.4.0.$1^{2,5}$.$1^{7,10}$]dodecanyl methacrylate, 3.9 g of 1-isopropylcyclopentyl methacrylate, 2.2 g of 3-hydroxy-1-adamantyl methacrylate, 5.9 g of Monomer 1, 5.9 g of 2-oxo-4,5-dimethyltetrahydrofuran-4-yl methacrylate, and 40 g of THF solvent. The reactor was cooled at −70° C. in nitrogen atmosphere, after which vacuum pumping and nitrogen blow were repeated three times. The reactor was warmed up to room temperature, whereupon 1.2 g of azobisisobutyronitrile (AIBN) as polymerization initiator was added. The reactor was heated at 60° C., whereupon reaction ran for 15 hours. The reaction solution was poured into 1 L of isopropyl alcohol for precipitation. The white solid precipitate was collected by filtration and dried in vacuum at 60° C., yielding a white polymer, designated Polymer 1. The polymer was analyzed by $^{13}$C- and $^{1}$H-NMR and GPC, with the results shown below.

Copolymer Composition Ratio (Molar Ratio)

1-isopropyl-exo-tetracyclo[4.4.0.$1^{2,5}$.$1^{7,10}$]dodecanyl methacrylate:1-isopropylcyclopentyl methacrylate:3-hydroxy-1-adamantyl methacrylate:Monomer 1:2-oxo-4,5-dimethyltetrahydrofuran-4-yl methacrylate=0.20:0.20:0.10:0.20:0.30

Mw=7,500

Mw/Mn=1.59

Polymer 1

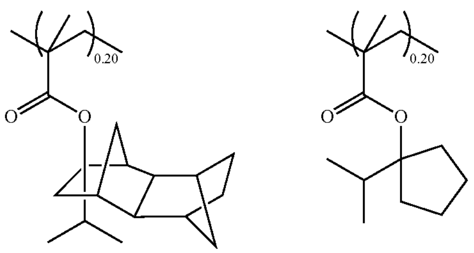

-continued

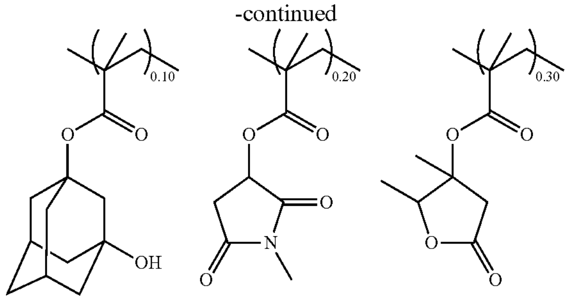

Synthesis Example 4

Synthesis of Polymer 2

A 2-L flask was charged with 11.7 g of Monomer 3, 2.2 g of 3-hydroxy-1-adamantyl methacrylate, 5.9 g of Monomer 1, 7.2 g of Monomer 4, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of isopropyl alcohol for precipitation. The white solid precipitate was collected by filtration and dried in vacuum at 60° C., yielding a white polymer, designated Polymer 2. The polymer was analyzed by $^{13}C$- and $^{1}H$-NMR and GPC, with the results shown below.

Copolymer Composition Ratio (Molar Ratio)

Monomer 3:3-hydroxy-1-adamantyl methacrylate:Monomer 1:Monomer 4-0.35:0.10:0.30:0.25

Mw=7,500

Mw/Mn=1.59

Polymer 2

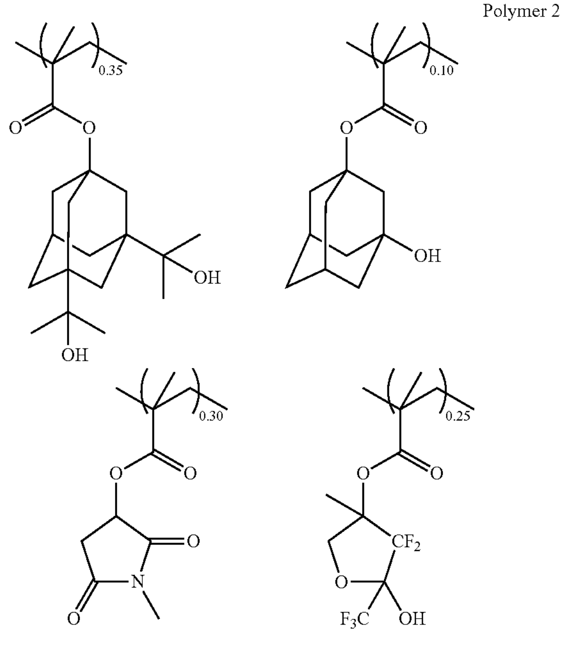

Synthesis Example 5

Synthesis of Polymer 3

A 2-L flask was charged with 5.2 g of 1-(adamantan-1-yl)-1-methylethyl methacrylate, 3.1 g of 4-(1-methylcyclopentyloxy)styrene, 8.9 g of Monomer 1, 4.4 g of 4-hydroxyphenyl methacrylate, 11.0 g of PAG Monomer 1, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of isopropyl alcohol for precipitation. The white solid precipitate was collected by filtration and dried in vacuum at 60° C., yielding a white polymer, designated Polymer 3. The polymer was analyzed by $^{13}C$- and $^{1}H$-NMR and GPC, with the results shown below.

Copolymer Composition Ratio (Molar Ratio)

1-(adamantan-1-yl)-1-methylethyl methacrylate:4-(1-methylcyclopentyloxy)styrene:Monomer 1:4-hydroxyphenyl methacrylate:PAG Monomer 1=0.20:0.15:0.30:0.20:0.15

Mw=9,300

Mw/Mn=1.76

Polymer 3

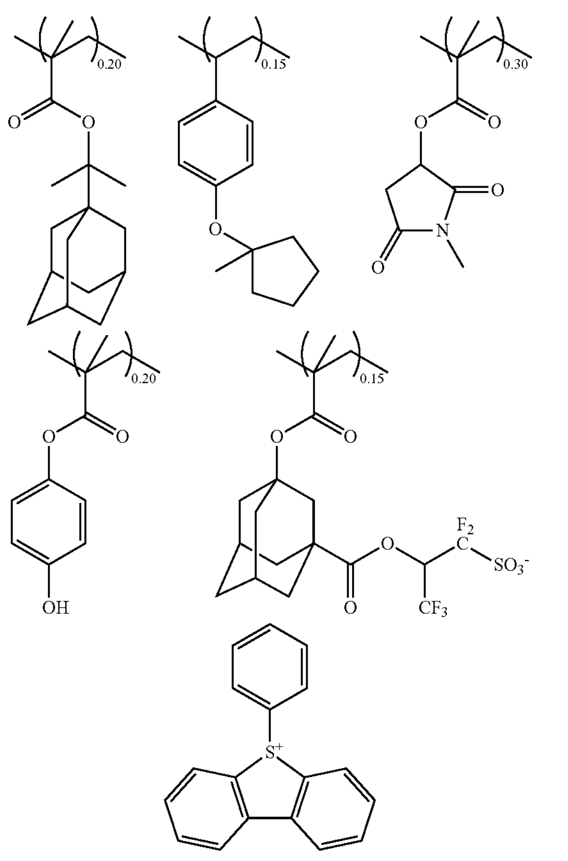

Synthesis Example 6

Synthesis of Polymer 4

A 2-L flask was charged with 13.7 g of 4-methylcyclohexyloxyphenyl methacrylate, 8.9 g of Monomer 1, 16.0 g of PAG Monomer 2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of isopropyl alcohol for precipitation. The white solid precipitate was collected by filtration and dried in vacuum at 60° C., yielding a white polymer, designated Polymer 4. The polymer was analyzed by $^{13}$C- and $^{1}$H-NMR and GPC, with the results shown below.

Copolymer Composition Ratio (Molar Ratio)

4-methylcyclohexyloxyphenyl methacrylate:Monomer 1:PAG Monomer 2=0.50:0.30:0.20

Mw=8,300

Mw/Mn=1.74

Polymer 4

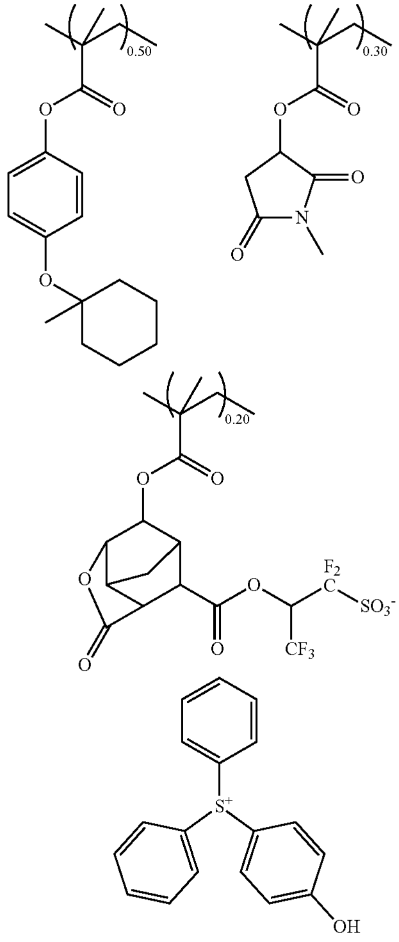

Synthesis Example 7

Synthesis of Polymer 5

A 2-L flask was charged with 5.6 g of 1-isopropyl-exo-tetracyclo$[4.4.0.1^{2,5}.1^{7,10}]$dodecanyl methacrylate, 3.9 g of 1-isopropylcyclopentyl methacrylate, 2.2 g of 3-hydroxy-1-adamantyl methacrylate, 12.9 g of Monomer 2, and 40 g of THF solvent. The reactor was cooled at −70° C. in nitrogen atmosphere, after which vacuum pumping and nitrogen blow were repeated three times. The reactor was warmed up to room temperature, whereupon 1.2 g of AIBN initiator was added. The reactor was heated at 60° C., whereupon reaction ran for 15 hours. The reaction solution was poured into 1 L of isopropyl alcohol for precipitation. The white solid precipitate was collected by filtration and dried in vacuum at 60° C., yielding a white polymer, designated Polymer 5. The polymer was analyzed by $^{13}$C- and $^{1}$H-NMR and GPC, with the results shown below.

Copolymer Composition Ratio (Molar Ratio)

1-isopropyl-exo-tetracyclo$[4.4.0.1^{2,5}.1^{7,10}]$dodecanyl methacrylate:1-isopropylcyclopentyl methacrylate:3-hydroxy-1-adamantyl methacrylate:Monomer 2=0.20:0.20:0.10:0.50

Mw=8,500

Mw/Mn=1.95

Polymer 5

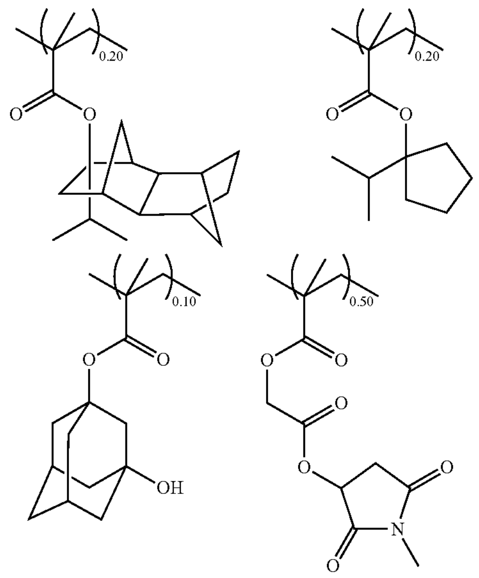

Comparative Synthesis Example 1

Comparative Polymer 1 was synthesized by the same procedure as in Synthesis Example 3 aside from omitting Monomer 1.

Copolymer Composition Ratio (Molar Ratio)

1-isopropyl-exo-tetracyclo$[4.4.0.1^{2,5}.1^{7,10}]$dodecanyl methacrylate:1-isopropylcyclopentyl methacrylate:3-hydroxy-1-adamantyl methacrylate:2-oxo-4,5-dimethyltetrahydrofuran-4-yl methacrylate=0.20:0.20:0.10:0.50

Mw=8,900

Mw/Mn=1.71

Comparative Polymer 1

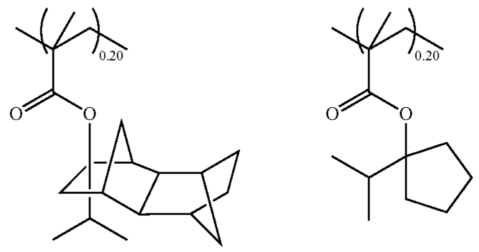

-continued

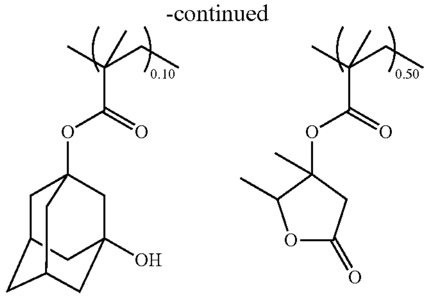

Comparative Synthesis Example 2

Comparative Polymer 2 was synthesized by the same procedure as in Synthesis Example 4 aside from using 2-oxo-4,5-dimethyltetrahydrofuran methacrylate instead of Monomer 1.

Copolymer Composition Ratio (Molar Ratio)

Monomer 3:3-hydroxy-1-adamantyl methacrylate:2-oxo-4,5-dimethyltetrahydrofuran methacrylate:Monomer 4=0.35:0.10:0.30:0.25

Mw=7,700

Mw/Mn=1.51

Comparative Polymer 2

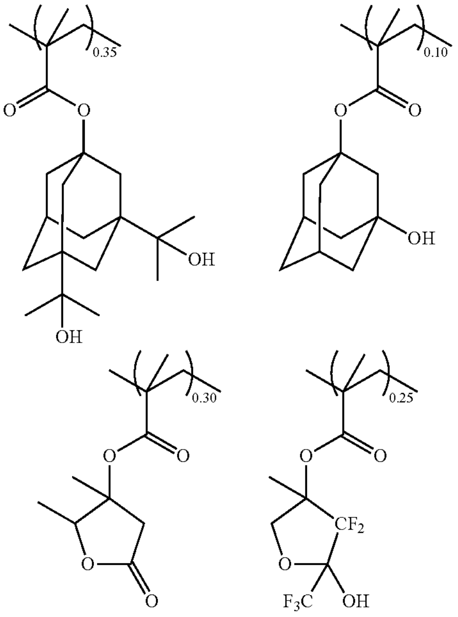

Comparative Synthesis Example 3

Comparative Polymer 3 was synthesized by the same procedure as in Synthesis Example 5 aside from using 2-oxotetrahydrofuran-3-yl methacrylate instead of Monomer 1.

Copolymer Composition Ratio (Molar Ratio)

1-(adamantan-1-yl)-1-methylethyl methacrylate:4-(1-methylcyclopentyloxy)styrene:2-oxotetrahydrofuran-3-yl methacrylate:4-hydroxyphenyl methacrylate:PAG Monomer 1=0.20:0.15:0.30:0.20:0.15

Mw=9,100

Mw/Mn=1.78

Comparative Polymer 3

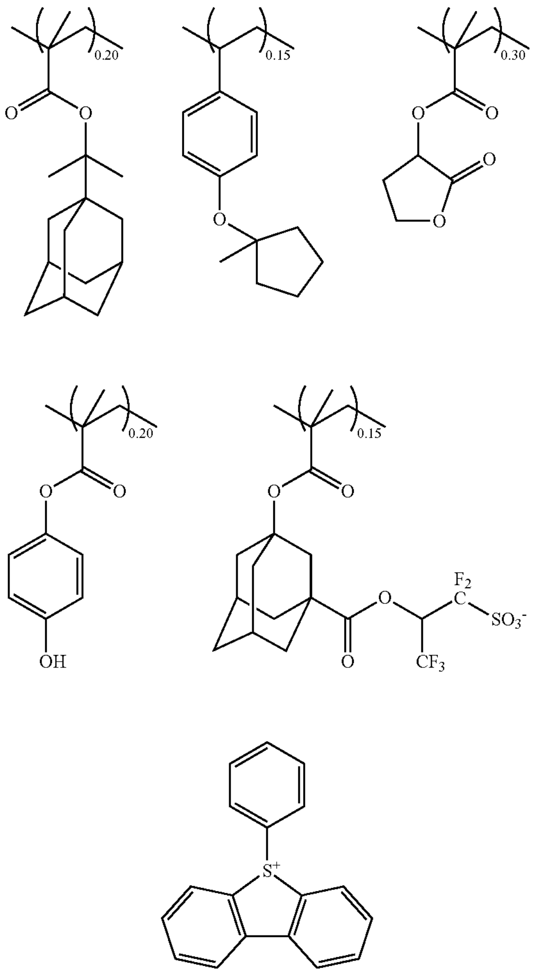

3. ArF Lithography Patterning

Examples 1-1 to 1-3 and Comparative Examples 1-1 to 1-2

Positive resist compositions (R-1 to R-5) were prepared by dissolving components in a solvent in accordance with the recipe shown in Table 1, and filtering through a filter having a pore size of 0.2 μm. The solvent contained 100 ppm of surfactant FC-4430 (3M-Sumitomo Co., Ltd.). The components in Table 1 are as identified below.

Organic Solvents:

PGMEA (propylene glycol monomethyl ether acetate)

GBL (γ-butyrolactone)

Acid generator: PAG1 of the following structural formula

Quencher: Quencher 1 of the following structural formula

Additive: Water repellent polymer 1 (Mw=12,800, Mw/Mn=1.71) of the following structural formula

PAG 1

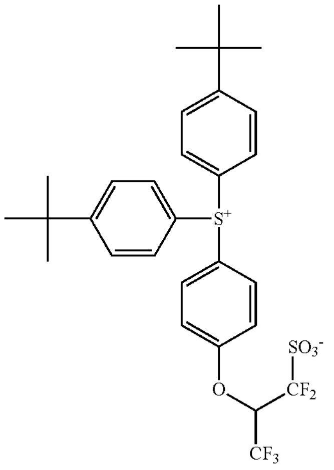

Quencher 1

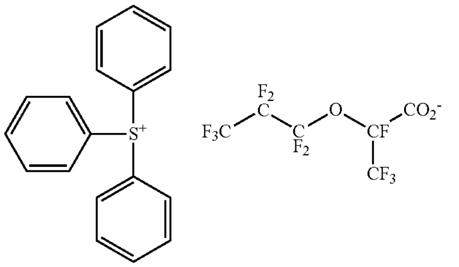

Water repellent polymer 1

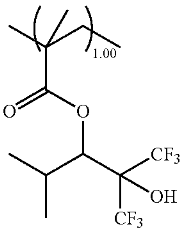

TABLE 1

| | Resist composition | Polymer (pbw) | Acid generator (pbw) | Quencher (pbw) | Additive (pbw) | Organic solvent (pbw) |
|---|---|---|---|---|---|---|
| Example 1-1 | R-1 | Polymer 1 (100) | PAG 1 (8.0) | Quencher 1 (3.0) | Water repellent polymer 1 (3) | PGMEA (2,500) GBL (500) |
| Example 1-2 | R-2 | Polymer 2 (100) | PAG 1 (8.0) | Quencher 1 (3.0) | Water repellent polymer 1 (3) | PGMEA (2,500) GBL (500) |
| Example 1-3 | R-3 | Polymer 5 (100) | PAG 1 (8.0) | Quencher 1 (3.0) | Water repellent polymer 1 (3) | PGMEA (2,500) GBL (500) |
| Comparative Example 1-1 | R-4 | Comparative Polymer 1 (100) | PAG 1 (8.0) | Quencher 1 (3.0) | Water repellent polymer 1 (3) | PGMEA (2,500) GBL (500) |
| Comparative Example 1-2 | R-5 | Comparative Polymer 2 (100) | PAG 1 (8.0) | Quencher 1 (3.0) | Water repellent polymer 1 (3) | PGMEA (2,500) GBL (500) |

On a substrate (silicon wafer), a spin-on carbon film ODL-101 (Shin-Etsu Chemical Co., Ltd.) having a carbon content of 80 wt % was deposited to a thickness of 160 nm and a silicon-containing spin-on hard mask SHB-A940 having a silicon content of 43 wt % was deposited thereon to a thickness of 35 nm. On this substrate for trilayer process, the resist composition (R-1 to R-5) was spin coated and baked on a hot plate at 80° C. for 60 seconds to form a resist film of 80 nm thick.

Using an ArF excimer laser immersion lithography scanner NSR-610C (Nikon Corp., NA 1.30, σ0.98/0.78, cross-pole opening 20 deg., azimuthally polarized illumination), exposure was performed in a varying dose through a 6% halftone phase shift mask bearing a lattice pattern with a pitch of 90 nm and a line width of 30 nm (on-wafer size). After the exposure, the wafer was baked (PEB) at the temperature shown in Table 2 for 60 seconds and developed. Specifically, the developer shown in Table 2 was injected from a development nozzle while the wafer was spun at 30 rpm for 3 seconds, which was followed by stationary puddle development for 27 seconds. The wafer was spin dried, yielding a negative pattern.

A hole pattern resulted from image reversal by solvent development. By observation under TDSEM (CG-4000, Hitachi High-Technologies Corp.), fifty (50) holes were picked up and measured for diameter, from which a variation (3σ) was computed as critical dimension uniformity (CDU). A cross-sectional profile of the hole pattern was observed under electron microscope (S-4300, Hitachi High-Technologies Corp.). The results are shown in Table 2.

TABLE 2

| | Resist composition | PEB temp. (° C.) | Dose (mJ/cm$^2$) | Developer | Hole size variation 3σ (nm) |
|---|---|---|---|---|---|
| Example 1-1 | R-1 | 95 | 34 | n-butyl acetate | 2.1 |
| Example 1-2 | R-2 | 100 | 35 | 2.38 wt % TMAH | 3.5 |
| Example 1-3 | R-3 | 95 | 38 | n-butyl acetate | 2.0 |
| Comparative Example 1-1 | R-4 | 90 | 42 | n-butyl acetate | 4.0 |
| Comparative Example 1-2 | R-5 | 90 | 38 | 2.38 wt % TMAH | 5.3 |

As is evident from the data in Table 2, the resist compositions within the scope of the invention ensure that the pattern is improved in CDU.

4. EB Lithography

Examples 2-1 to 2-2 and Comparative Example 2-1

Positive resist compositions (R-6 to R-8) were prepared by dissolving components in a solvent in accordance with the recipe shown in Table 3, and filtering through a filter having a pore size of 0.2 μm. The solvent contained 100 ppm of surfactant FC-4430 (3M-Sumitomo Co., Ltd.). The components in Table 3 are as identified below.

Organic Solvents:

PGMEA (propylene glycol monomethyl ether acetate)

PGME (propylene glycol monomethyl ether)

CyH (cyclohexanone)

Basic Compound: Amine 1 of the Following Structural Formula

Amine 1

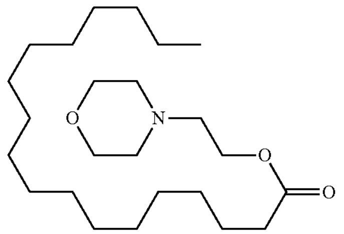

TABLE 3

| | Resist composition | Polymer (pbw) | Basic compound (pbw) | Organic solvent (pbw) |
|---|---|---|---|---|
| Example 2-1 | R-6 | Polymer 3 (100) | Amine 1 (1.0) | PGMEA (500) CyH (1,200) PGME (200) |
| Example 2-2 | R-7 | Polymer 4 (100) | Amine 1 (1.0) | PGMEA (500) CyH (1,200) PGME (200) |
| Comparative Example 2-1 | R-8 | Comparative Polymer 3 (100) | Amine 1 (1.0) | PGMEA (500) CyH (1,200) PGME (200) |

Using a coater/developer system Clean Track Mark 5 (Tokyo Electron Ltd.), the positive resist composition (R-6 to R-8) was spin coated onto a silicon substrate of diameter 6 inches (which had been vapor primed with hexamethyldisilazane) and prebaked on a hot plate at 110° C. for 60 seconds to form a resist film of 100 nm thick. Using a system HL-800D (Hitachi Ltd.) at a HV voltage of 50 kV, the resist film was exposed imagewise to EB in a vacuum chamber.

Using Clean Track Mark 5, immediately after the exposure, the resist film was baked (PEB) on a hot plate at the temperature shown in Table 4 for 60 seconds and puddle developed in a 2.38 wt % TMAH aqueous solution for 30 seconds to form a positive pattern.

Resolution is a minimum size at the exposure dose (sensitivity) that provides a 1:1 resolution of a 100-nm line-and-space pattern. The 100-nm L/S pattern was measured for roughness (LWR) under SEM. The results are shown in Table 4.

TABLE 4

| | Resist composition | PEB temp. (° C.) | Sensitivity ($\mu C/cm^2$) | Resolution (nm) | LWR (nm) |
|---|---|---|---|---|---|
| Example 2-1 | R-6 | 90 | 32.9 | 70 | 5.1 |
| Example 2-2 | R-7 | 75 | 34.3 | 65 | 4.2 |
| Comparative Example 2-1 | R-8 | 85 | 30.5 | 80 | 6.1 |

Japanese Patent Application Nos. 2016-063442 and 2016-175472 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising as base resin a polymer comprising recurring units represented by the formula (a) and recurring units containing a group capable of polarity switch with the aid of acid, the polymer having a weight average molecular weight of 1,000 to 500,000,

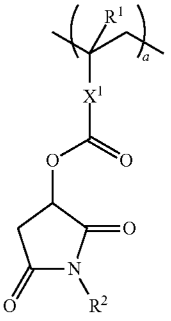

(a)

wherein $R^1$ is hydrogen or methyl, $R^2$ is hydrogen, a $C_1$-$C_8$ straight, branched or cyclic alkyl group, $C_2$-$C_6$ straight, branched or cyclic acyl group, or $C_2$-$C_6$ straight, branched or cyclic alkoxycarbonyl group, $X^1$ is a single bond, phenylene group, naphthylene group, or $C_1$-$C_{12}$ linking group containing an ester moiety, ether moiety or lactone ring, and a represents a molar fraction of the recurring units of formula (a) in the polymer and is a positive number in the range: 0<a<1.0, wherein the recurring unit containing a group capable of polarity switch with the aid of acid is a recurring unit which switches from hydrophilic to hydrophobic due to dehydration reaction with the aid of acid.

2. The resist composition of claim 1 wherein the recurring unit containing a group capable of polarity switch with the aid of acid is derived from a monomer selected from the following monomers:

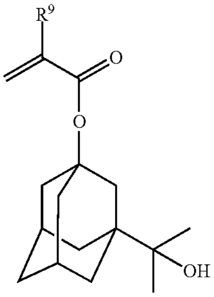

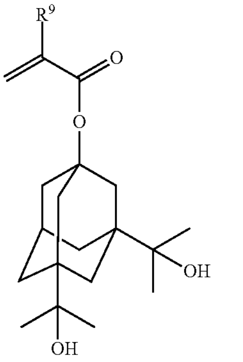

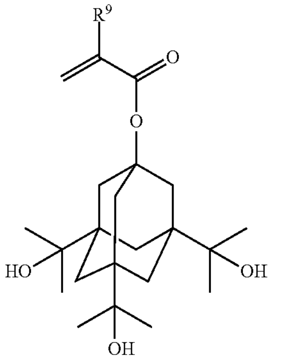

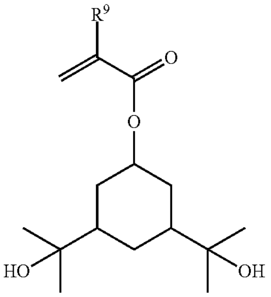

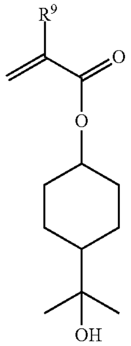

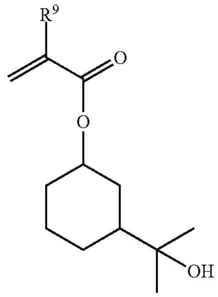

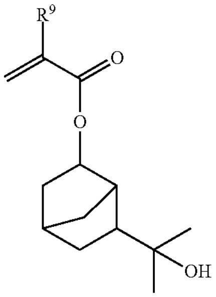

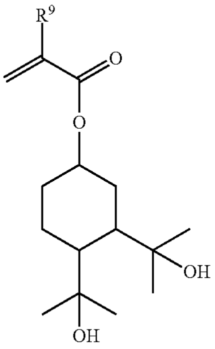

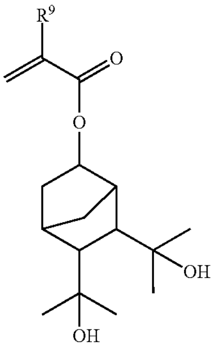

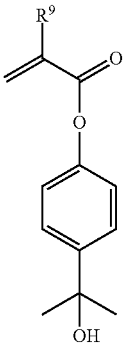

-continued

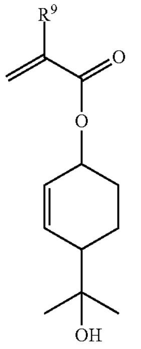

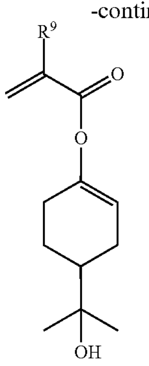

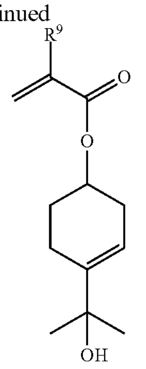

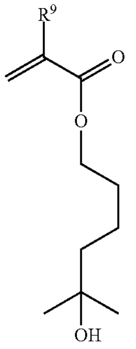

wherein $R^9$ is hydrogen or methyl.

3. The resist composition of claim 1 wherein the polymer further comprises recurring units having an adhesive group selected from the group consisting of hydroxyl, carboxyl, lactone ring, carbonate, thiocarbonate, carbonyl, cyclic acetal, ether, ester, sulfonic acid ester, cyano, amide, and —O—C(═O )-G- wherein G is —S— or —NH—.

4. The resist composition of claim 1 wherein the polymer further comprises recurring units of at least one selected from recurring units represented by the formulae (d1) to (d3):

(d1)

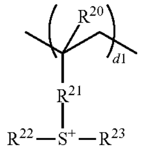

(d2)

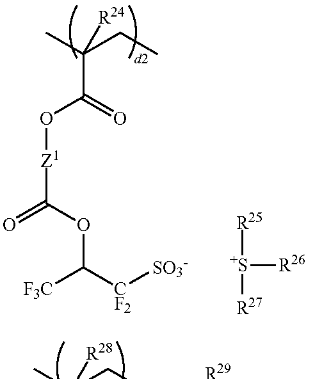

(d3)

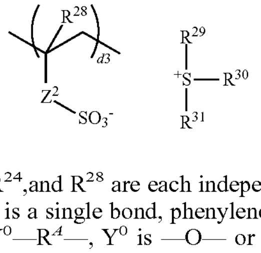

wherein $R^{20}$, $R^{24}$,and $R^{28}$ are each independently hydrogen or methyl, $R^{21}$ is a single bond, phenylenc, —O—$R^A$—, or —C(═O )—$Y^0$—$R^A$—, $Y^0$ is —O— or —NH—, $R^A$ is a $C_1$-$C_6$ straight, branched or cyclic alkylene or $C_2$-$C_6$ straight, branched or cyclic alkenylene group which may contain a carbonyl, ester, ether or hydroxyl moiety, or phenylene group, $R^{22}$, $R^{23}$, $R^{25}$, $R^{26}$, $R^{27}$, $R^{29}$, $R^{30}$, and $R^{31}$ are are each independently a $C_1$-$C_{12}$ straight, branched or cyclic alkyl group which may contain a carbonyl, ester, ether or hydroxyl moiety, or a $C_6$-$C_{12}$ aryl, $C_7$-$C_{20}$ aralkyl, or mercaptophenyl group, $Z^1$ is a single bond, a $C_1$-$C_{12}$ straight, branched or cyclic alkylene or $C_2$-$C_{12}$ straight, branched or cyclic alkenylene group which may contain an ether moiety, ester moiety or lactone ring, or $C_6$-$C_{10}$ arylene group, $Z^2$ is a single bond, methylene, ethylene, phenylene, fluorinated phenylene, —O—$R^{32}$—, or —C(═O )—$Z^3$—$R^{32}$—, $Z^3$ is —O— or —NH—, $R^{32}$ is a $C_1$-$C_{12}$ straight, branched or cyclic alkylene or $C_2$-$C_{12}$ alkenylene group which may contain a carbonyl, ester, ether or hydroxyl moiety, or phenylene group, $M^-$is a non-nucleophilic counter ion, d1, d2 and d3 represent molar fractions of recurring units of formulas (d1), (d2) and (d3), respectively, in the polymer and are numbers in the range: $0 \le d1 \le 0.5$, $0 \le d2 \le 0.5$, $0 \le d3 \le 0.5$, and $0 < d1+d2+d3 \le 0.5$.

5. The resist composition of claim 1, further comprising an acid generator and an organic solvent.

6. The resist composition of claim 1, further comprising a basic compound and/or a surfactant.

7. A pattern forming process comprising the steps of applying the resist composition of claim 1 onto a substrate to form a coating, baking, exposing the coating to high-energy radiation, and developing the exposed coating in a developer.

8. The process of claim 7 wherein the high-energy radiation is i-line, KrF excimer laser, ArF excimer laser, EB or EUV of wavelength 3 to 15 nm.

* * * * *